(12) United States Patent
Scheuerlein

(10) Patent No.: US 8,270,210 B2
(45) Date of Patent: *Sep. 18, 2012

(54) PULSE RESET FOR NON-VOLATILE STORAGE

(75) Inventor: Roy E. Scheuerlein, Cupertino, CA (US)

(73) Assignee: SanDisk 3D, LLC, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/154,795

(22) Filed: Jun. 7, 2011

(65) Prior Publication Data

US 2011/0235404 A1 Sep. 29, 2011

Related U.S. Application Data

(63) Continuation of application No. 12/339,363, filed on Dec. 19, 2008, now Pat. No. 7,978,507.

(60) Provisional application No. 61/076,553, filed on Jun. 27, 2008.

(51) Int. Cl.
*G11C 11/00* (2006.01)

(52) U.S. Cl. .......................... 365/163; 365/148; 365/100

(58) Field of Classification Search .................. 365/163, 365/148, 100
See application file for complete search history.

(56) References Cited

U.S. PATENT DOCUMENTS

| | | | |
|---|---|---|---|
| 3,886,577 A | 5/1975 | Buckley | |
| 5,818,749 A | 10/1998 | Harshfield | |
| 6,483,734 B1 | 11/2002 | Sharma | |
| 6,574,145 B2 | 6/2003 | Kleveland | |
| 6,795,338 B2 | 9/2004 | Parkinson | |
| 6,862,213 B2 | 3/2005 | Hamaguchi | |
| 7,057,922 B2 | 6/2006 | Fukumoto | |
| 7,236,390 B1 | 6/2007 | Chang | |
| 7,362,604 B2 | 4/2008 | Scheuerlein | |
| 7,372,725 B2 | 5/2008 | Philipp | |
| 7,391,638 B2 | 6/2008 | Fasoli | |
| 7,420,850 B2 | 9/2008 | Fasoli | |
| 7,577,023 B2 * | 8/2009 | Philipp et al. | 365/163 |
| 7,599,224 B2 * | 10/2009 | Lee | 365/185.22 |
| 7,869,258 B2 | 1/2011 | Scheuerlein | |

(Continued)

FOREIGN PATENT DOCUMENTS

EP 1326258 7/2003

(Continued)

OTHER PUBLICATIONS

Partial International Search dated Oct. 2, 2009, PCT Patent Appl. No. PCT/US2009/048956.

(Continued)

*Primary Examiner* — Son T Dinh
*Assistant Examiner* — Nam Nguyen
(74) *Attorney, Agent, or Firm* — Vierra Magen Marcus & DeNiro LLP

(57) ABSTRACT

A non-volatile storage system includes a substrate, control circuitry on the substrate, a three dimensional memory array (above the substrate) that includes a plurality of memory cells with reversible resistance-switching elements, and circuits to SET and RESET the resistance-switching elements. The circuits that RESET the resistance-switching elements provide a pulse to the memory cells that is large enough in magnitude to SET and RESET the memory cells, and long enough to potentially RESET the memory cell but not long enough to SET the memory cells.

22 Claims, 21 Drawing Sheets

U.S. PATENT DOCUMENTS

| | | | |
|---|---|---|---|
| 7,978,507 B2 * | 7/2011 | Scheuerlein | ............... 365/163 |
| 2003/0002332 A1 | 1/2003 | Lowrey | |
| 2003/0173612 A1 | 9/2003 | Krieger | |
| 2004/0109377 A1 | 6/2004 | Ooishi | |
| 2004/0114419 A1 | 6/2004 | Lowrey | |
| 2004/0264234 A1 | 12/2004 | Moore | |
| 2005/0226067 A1 | 10/2005 | Herner | |
| 2006/0091373 A1 | 5/2006 | Lee | |
| 2006/0109704 A1 | 5/2006 | Seo | |
| 2006/0157679 A1 | 7/2006 | Scheuerlein | |
| 2006/0250836 A1 | 11/2006 | Herner | |
| 2007/0069276 A1 | 3/2007 | Scheuerlein | |
| 2007/0268742 A1 | 11/2007 | Liu | |
| 2008/0025068 A1 | 1/2008 | Scheuerlein | |
| 2008/0025076 A1 | 1/2008 | Scheuerlein | |
| 2008/0025132 A1 | 1/2008 | Fasoli | |
| 2008/0112218 A1 | 5/2008 | Katagiri | |
| 2009/0323392 A1 | 12/2009 | Fasoli et al. | |
| 2009/0323393 A1 | 12/2009 | Scheuerlein | |

FOREIGN PATENT DOCUMENTS

| | | |
|---|---|---|
| EP | 1426971 | 6/2004 |
| EP | 1755126 | 2/2007 |
| WO | WO03085675 | 10/2003 |
| WO | WO2007038665 | 4/2007 |
| WO | WO2008016844 | 2/2008 |

OTHER PUBLICATIONS

International Search Report dated Dec. 7, 2009, PCT Patent Appl. No. PCT/US2009/048956.

Written Opinion of the International Searching dated Dec. 7, 2009, PCT Patent Appl. No. PCT/US2009/048956.

Response to Written Opinion, dated Mar. 11, 2011, European Patent Application No. 09771208.7.

Notice of Allowance dated Mar. 31, 2011, U.S. Appl. No. 12/339,363.

* cited by examiner

PULSE RESET FOR NON-VOLATILE STORAGE

This application is a continuation application of U.S. patent application Ser. No. 12/339,363, "Pulse Reset for Non-Volatile Storage," filed on Dec. 19, 2008, by Scheuerlein, which claims priority from provisional application 61/076,553, filed on Jun. 27, 2008, both of which are incorporated herein by reference in its entirety.

BACKGROUND

1. Field

The present invention relates to technology for data storage.

2. Description of the Related Art

A variety of materials show reversible resistance-switching behavior. These materials include chalcogenides, carbon polymers, perovskites, and certain metal oxides and nitrides. Specifically, there are metal oxides and nitrides which include only one metal and exhibit reliable resistance switching behavior. This group includes, for example, NiO, $Nb_2O_5$, $TiO_2$, $HfO_2$, $Al_2O_3$, $MgO_x$, $CrO_2$, VO, BN, and AlN, as described by Pagnia and Sotnick in "Bistable Switching in Electroformed Metal-Insulator-Metal Device," Phys. Stat. Sol. (A) 108, 11-65 (1988). A layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-switching material to a stable low-resistance state. This conversion can be repeated many times. For some materials, the initial state is high-resistance rather than low-resistance.

These reversible resistance-switching materials are of interest for use in nonvolatile memory arrays. One resistance state may correspond to a data "0," for example, while the other resistance state corresponds to a data "1." Some of these materials may have more than two stable resistance states.

Non-volatile memories formed from reversible resistance-switching elements are known. For example, U.S. Patent Application Publication 2006/0250836, filed May 9, 2005 and titled "REWRITEABLE MEMORY CELL COMPRISING A DIODE AND A RESISTANCE-SWITCHING MATERIAL," which is hereby incorporated by reference herein in its entirety, describes a rewriteable non-volatile memory cell that includes a diode coupled in series with a reversible resistance-switching material such as a metal oxide or metal nitride.

However, operating memory devices that employ reversible resistance-switching materials is difficult.

SUMMARY

A storage system is described that uses reversible resistance-switching elements. Various circuits and methods are disclosed for controlling the setting and resetting of the resistance for the reversible resistance-switching elements.

One embodiment includes a substrate, control circuitry on the substrate, a three dimensional memory array (above the substrate) that includes a plurality of memory cells with reversible resistance-switching elements, and circuits to SET and RESET the resistance-switching elements. The circuits that RESET the resistance-switching elements provide a pulse to the memory cells that is large enough in magnitude to SET and RESET the memory cells, and long enough to potentially RESET the memory cell but not long enough to SET the memory cells.

One embodiment includes programming a non-volatile storage element from a first predetermined resistance state to a second predetermined resistance state by applying a programming voltage for a first period of time (e.g., duration of a pulse). The non-volatile storage element changes from the first predetermined resistance state to the second predetermined resistance state in response to a first voltage magnitude. The non-volatile storage element changes from the second predetermined resistance state to the first predetermined resistance state in response to a second voltage magnitude. The programming voltage is at least as large as the second voltage magnitude. The first period of time is shorter than needed to change the non-volatile storage element to the first predetermined resistance state in response to the programming voltage.

One embodiment of a non-volatile storage system includes a non-volatile storage element, a voltage providing circuit that selectively provides a programming voltage, and a selection circuit that selectively connects the non-volatile storage element to the voltage providing circuit for a first period of time. The non-volatile storage element changes from a first predetermined resistance state to a second predetermined resistance state in response to a first voltage magnitude. The non-volatile storage element changes from the second predetermined resistance state to the first predetermined resistance state in response to a second voltage magnitude. The programming voltage is at least as large the second voltage magnitude. The first period of time is shorter than needed to change the non-volatile storage element to the first predetermined resistance state in response to the programming voltage.

One embodiment of a non-volatile storage system includes a non-volatile storage element and an electrical circuit in communication with the non-volatile storage element. The electrical circuit programs the non-volatile storage element from a first predetermined resistance state to a second predetermined resistance state by a applying a programming voltage for a first period of time. The non-volatile storage element changes from the first predetermined resistance state to the second predetermined resistance state in response to a first voltage magnitude. The non-volatile storage element changes from the second predetermined resistance state to the first predetermined resistance state in response to a second voltage magnitude. The programming voltage is at least as large as the second voltage magnitude. The first period of time is shorter than needed to change the non-volatile storage element to the first predetermined resistance state in response to the programming voltage.

In some implementations, the second voltage magnitude is greater than or equal to the first voltage magnitude. In other implementations, the first voltage magnitude is greater than or equal to the second voltage magnitude.

DETAILED DESCRIPTION

A memory system is provided that includes memory cells with a reversible resistivity-switching element. Various circuits and methods are disclosed for controlling the setting and resetting of the resistance for the reversible resistance-switching elements.

Memory Cell and System

Figure 1:
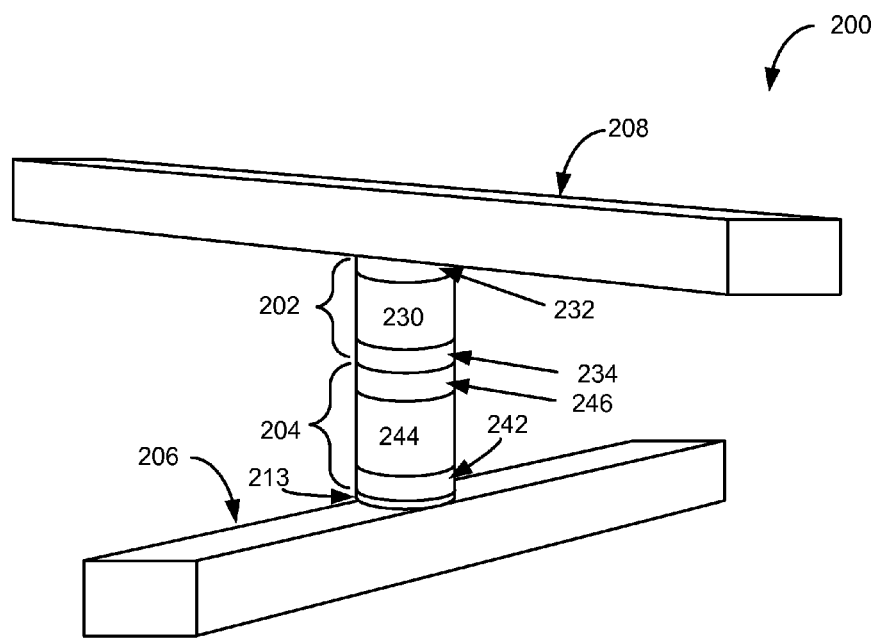
FIG. 1 is a simplified prospective view of one embodiment of a memory cell with a reversible resistance-switching element.

FIG. 1 is a simplified perspective view of one embodiment of a memory cell 200 which includes a reversible resistance-switching element 202 coupled in series with a steering element 204 between a first conductor 206 and a second conductor 208.

Reversible resistance-switching element 202 includes reversible resistivity-switching material 230 having a resistivity that may be reversibly switched between two or more states. For example, the reversible resistivity-switching material may be in an initial high-resistivity state upon fabrication that is switchable to a low-resistivity state upon application of a first voltage and/or current. Application of a second voltage and/or current may return the reversible resistivity-switching material to the high-resistivity state. Alternatively, the reversible resistance-switching element may be in an initial low-resistance state upon fabrication that is reversibly switchable to a high-resistance state upon application of the appropriate voltage(s) and/or current(s). When used in a memory cell, one resistance state may represent a binary "0" while another resistance state may represent a binary "1." However, more than two data/resistance states may be used. Numerous reversible resistivity-switching materials and operation of memory cells employing reversible resistance-switching materials are described, for example, in U.S. Patent Application Publication 2006/0250836, previously incorporated.

In one embodiment, the process of switching the resistance from the high-resistivity state to the low-resistivity state is referred to as SETTING the reversible resistance-switching element 202. The process of switching the resistance from the low-resistivity state to the high-resistivity state is referred to as RESETTING the reversible resistance-switching element 202. The high-resistivity state is associated with binary data "0" and the low-resistivity state is associated with binary data "1." In other embodiments, SETTING and RESETTING and/or the data encoding can be reversed.

In some embodiments, reversible resistance-switching material 230 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 230 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO-, $NiO_x$- or $NiO_xP_y$-containing layer may be selectively deposited above the steering element 204 using a selective deposition process and then annealed and/or oxidized (if necessary).

Other materials may be selectively deposited, and then annealed and/or oxidized if necessary, in accordance with the present invention to form reversible resistivity-switching materials for use in memory cells. For example, a layer of Nb, Ta, V, Al, Ti, Co, cobalt-nickel alloy, etc., may be selectively deposited, such as by electroplating, and oxidized to form a reversible resistivity-switching material.

More information about fabricating a memory cell using reversible resistance-switching material can be found in U.S.

patent application Ser. No. 11/772,084, "Memory Cell That Employs A Selectively Deposited Reversible Resistance Switching Element and Methods of Forming The Same," filed on Jun. 29, 2007, incorporated herein by reference in its entirety.

Reversible resistance-switching element 202 includes electrodes 232 and 234. Electrode 232 is positioned between metal oxide reversible resistivity-switching material 230 and conductor 208. In one embodiment, electrode 232 is made of platinum. Electrode 234 is positioned between metal oxide reversible resistivity-switching material 230 and diode 204. In one embodiment, electrode 234 is made of Titanium Nitride, and serves as a barrier layer.

Steering element 204 can be a diode, or other suitable steering element that exhibits non-ohmic conduction by selectively limiting the voltage across and/or the current flow through the reversible resistance-switching element 202. In this manner, the memory cell 200 may be used as part of a two or three dimensional memory array and data may be written to and/or read from the memory cell 200 without affecting the state of other memory cells in the array. Diode 204 may include any suitable diode such as a vertical polycrystalline p-n or p-i-n diode, whether upward pointing with an n-region above a p-region of the diode or downward pointing with a p-region above an n-region of the diode.

In some embodiments, diode 204 may be formed from a polycrystalline semiconductor material such as polysilicon, a polycrystalline silicon-germanium alloy, polygermanium or any other suitable material. For example, the diode 204 may include a heavily doped n+ polysilicon region 242, a lightly doped or an intrinsic (unintentionally doped) polysilicon region 244 above the n+ polysilicon region 242, and a heavily doped p+ polysilicon region 246 above the intrinsic region 244. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 242 to prevent and/or reduce dopant migration from the n+ polysilicon region 242 into the intrinsic region 244, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed.

When diode 204 is fabricated from deposited silicon (e.g., amorphous or polycrystalline), a silicide layer may be formed on the diode to place the deposited silicon in a low resistivity state, as fabricated. Such a low resistivity state allows for easier programming of the memory cell as a large voltage is not required to switch the deposited silicon to a low resistivity state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistivity silicon thereby is provided. Similar results may be achieved for silicon-germanium alloy and/or germanium diodes.

Conductors 206 and 208 include any suitable conductive material such as tungsten, any appropriate metal, heavily doped semiconductor material, a conductive silicide, a conductive silicide-germanide, a conductive germanide, or the like. In the embodiment of FIG. 1, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistance-switching element 202 is shown as being positioned above the steering element 204 in FIG. 1, it will be understood that in alternative embodiments, the reversible resistance-switching element 202 may be positioned below the steering element 204.

Figure 2:
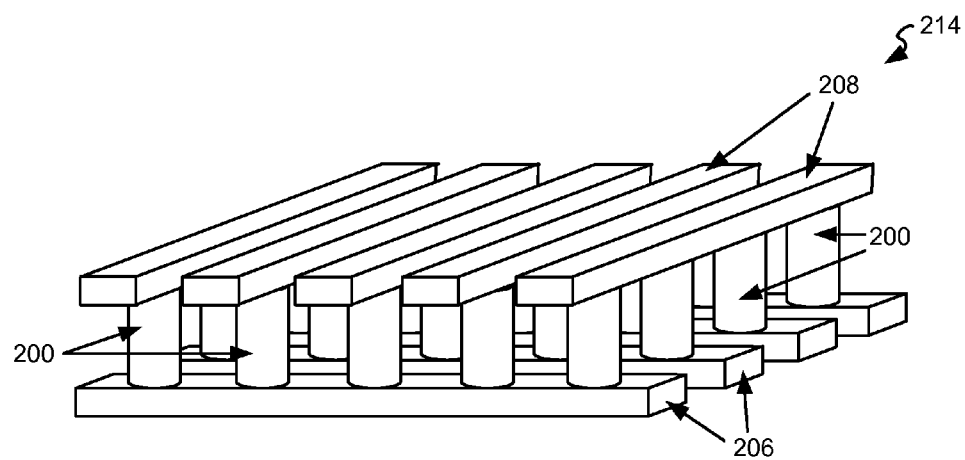
FIG. 2 is a simplified prospective view of a portion of a first memory level formed from a plurality of the memory cells of FIG. 1.

FIG. 2 is a simplified perspective view of a portion of a first memory level 214 formed from a plurality of the memory cells 200 of FIG. 1. For simplicity, the reversible resistance-switching element 202, the diode 204, and barrier layer 213 are not separately shown. The memory array 214 is a "crosspoint" array including a plurality of bit lines (second conductors 208) and word lines (first conductors 206) to which multiple memory cells are coupled (as shown). Other memory array configurations may be used, as may multiple levels of memory.

Figure 3:
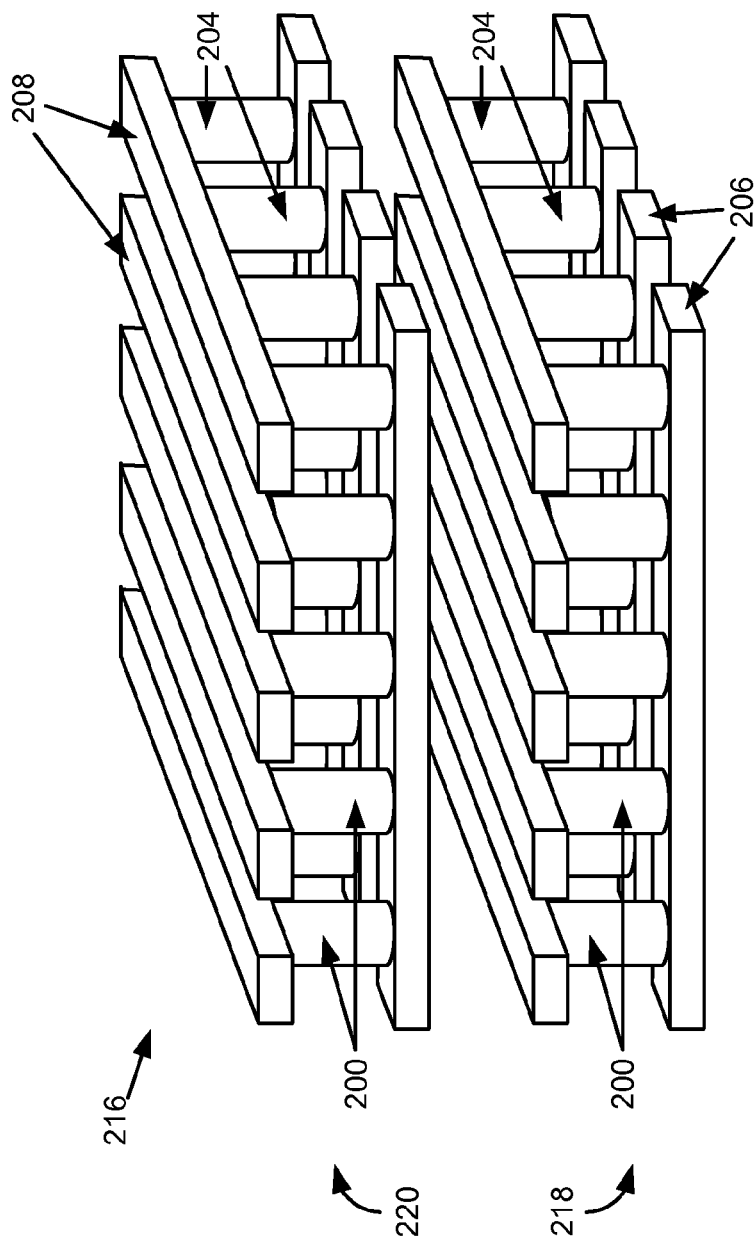
FIG. 3 is a simplified prospective view of a portion of a three dimensional memory array.

FIG. 3 is a simplified perspective view of a portion of a monolithic three dimensional array 216 that includes a first memory level 218 positioned below a second memory level 220. In the embodiment of FIG. 3, each memory level 218 and 220 includes a plurality of memory cells 200 in a cross-point array. It will be understood that additional layers (e.g., an inter-level dielectric) may be present between the first and second memory levels 218 and 220, but are not shown in FIG. 3 for simplicity. Other memory array configurations may be used, as may additional levels of memory. In the embodiment of FIG. 3, all diodes may "point" in the same direction, such as upward or downward depending on whether p-i-n diodes having a p-doped region on the bottom or top of the diode are employed, simplifying diode fabrication.

Figure 4:
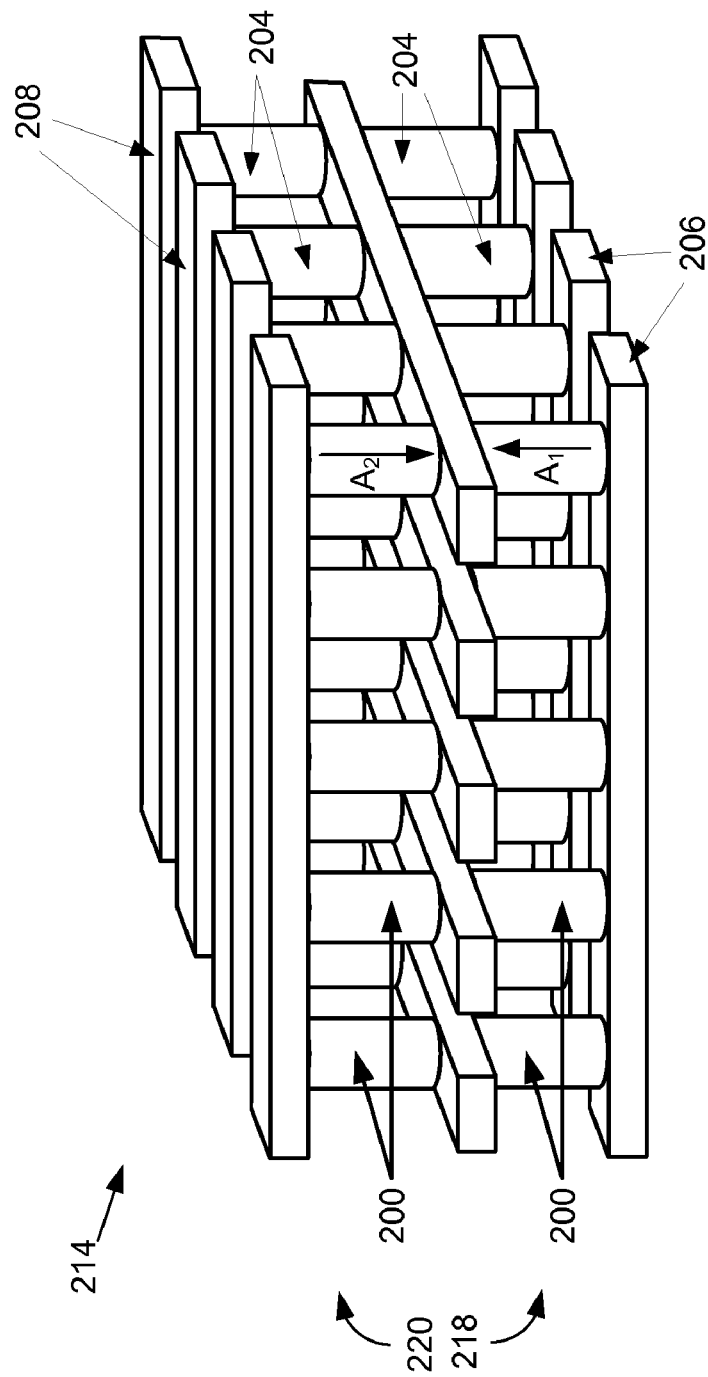
FIG. 4 is a simplified prospective view of a portion of a three dimensional memory array.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 4. In such embodiments, the diodes on adjacent memory levels preferably point in opposite directions, as described in U.S. patent application Ser. No. 11/692,151, filed Mar. 27, 2007 and titled "Large Array Of Upward Pointing P-I-N Diodes Having Large And Uniform Current," which is hereby incorporated by reference herein in its entirety. For example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 5:
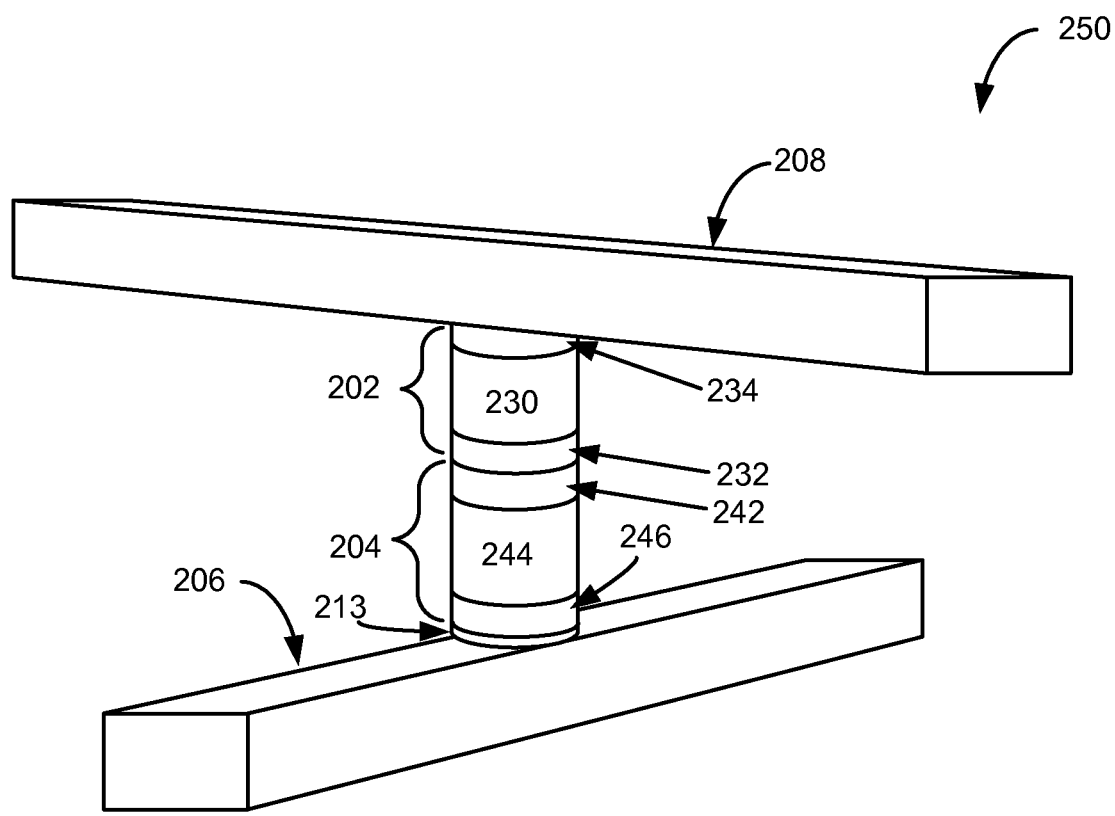
FIG. 5 is a simplified prospective view of another embodiment of a memory cell with a reversible resistance-switching element.

FIG. 5 shows a memory cell 250, which is a variation of memory cell 200 of FIG. 1. Memory cell 250 differs from memory cell 200 of FIG. 1 because the positions of electrodes 232 and 234 are swapped. That is, platinum electrode 232 is positioned between metal oxide reversible resistivity-switching material 230 and diode 204, while Titanium Nitride electrode 234 is positioned between metal oxide reversible resistivity-switching material 230 and conductor 208. It also differs from memory cell 200 of FIG. 1 because the location of n+ region 242 and p+ region 246 are reversed. A heavily doped n+ polysilicon region 242 is above the intrinsic region 244 and a heavily doped p+ polysilicon region 246 is below. This arrangement is useful to SET the reversible resistance-switching element when the diode 204 is reverse biased as explained in more detail below.

FIGS. 1-5 show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

Figure 6:
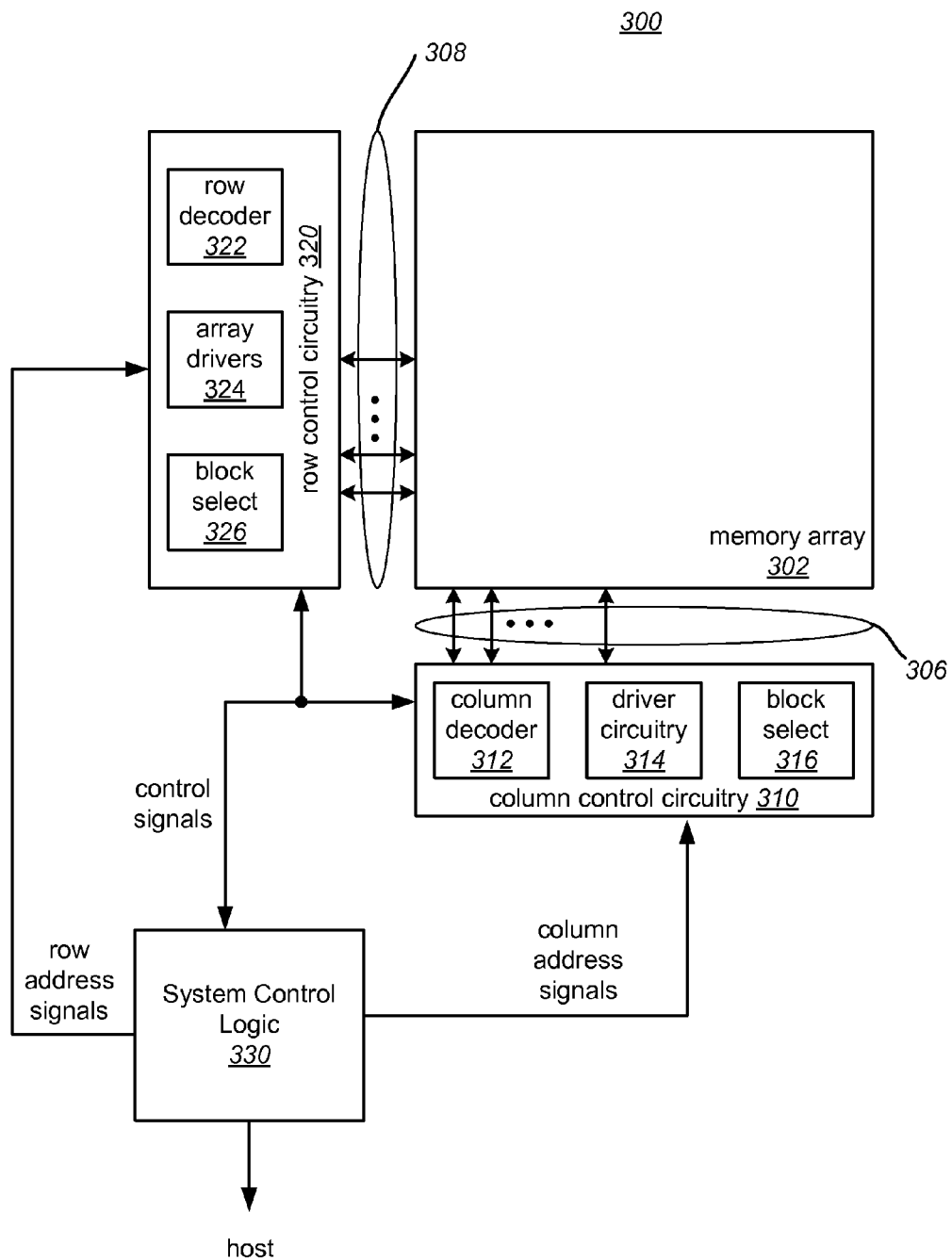
FIG. 6 is a block diagram of one embodiment of a memory system.

FIG. 6 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

In one embodiment, all of the components depicted in FIG. 6 are arranged on a single integrated circuit. For example, system control logic 330, column control circuitry 310 and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

SET with Current Limiting

Figure 7:
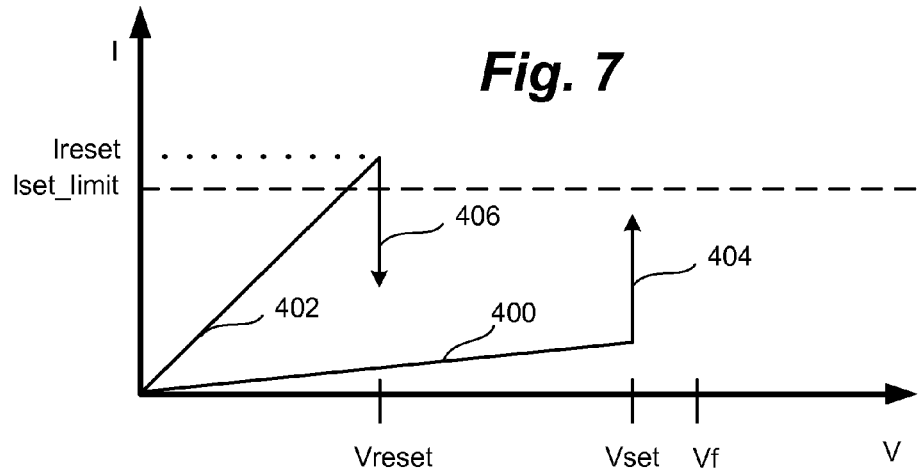
FIG. 7 is a graph depicting I-V characteristics of a reversible resistance-switching element.

As described above, reversible resistance-switching element 202 may be reversibly switched between two or more states. For example, the reversible resistivity-switching material may be in an initial, high-resistivity state upon fabrication that is switchable to a low-resistivity state upon application of a first voltage and/or current. Application of a second voltage and/or current may return the reversible resistivity-switching material to a high-resistivity state. FIG. 7 is a graph of voltage versus current for one example embodiment of a metal oxide reversible resistance-switching element. Line 400 represents the I-V characteristics of the reversible resistance-switching element when in the high-resistivity state ($R_{OFF}$). Line 402 represents the I-V characteristics of the reversible resistance-switching element when in the low-resistivity state ($R_{ON}$).

To determine which state the reversible resistance-switching element is in, a voltage is applied and the resulting current is measured. A higher measured current (see line 402) indicates that the reversible resistance-switching element is in the low-resistivity state. A lower measured current (see line 400) indicates that the reversible resistance-switching element is in the high-resistivity state. Note that other variations of a reversible resistance-switching element having different I-V characteristics can also be used with the technology herein.

Figure 7A:
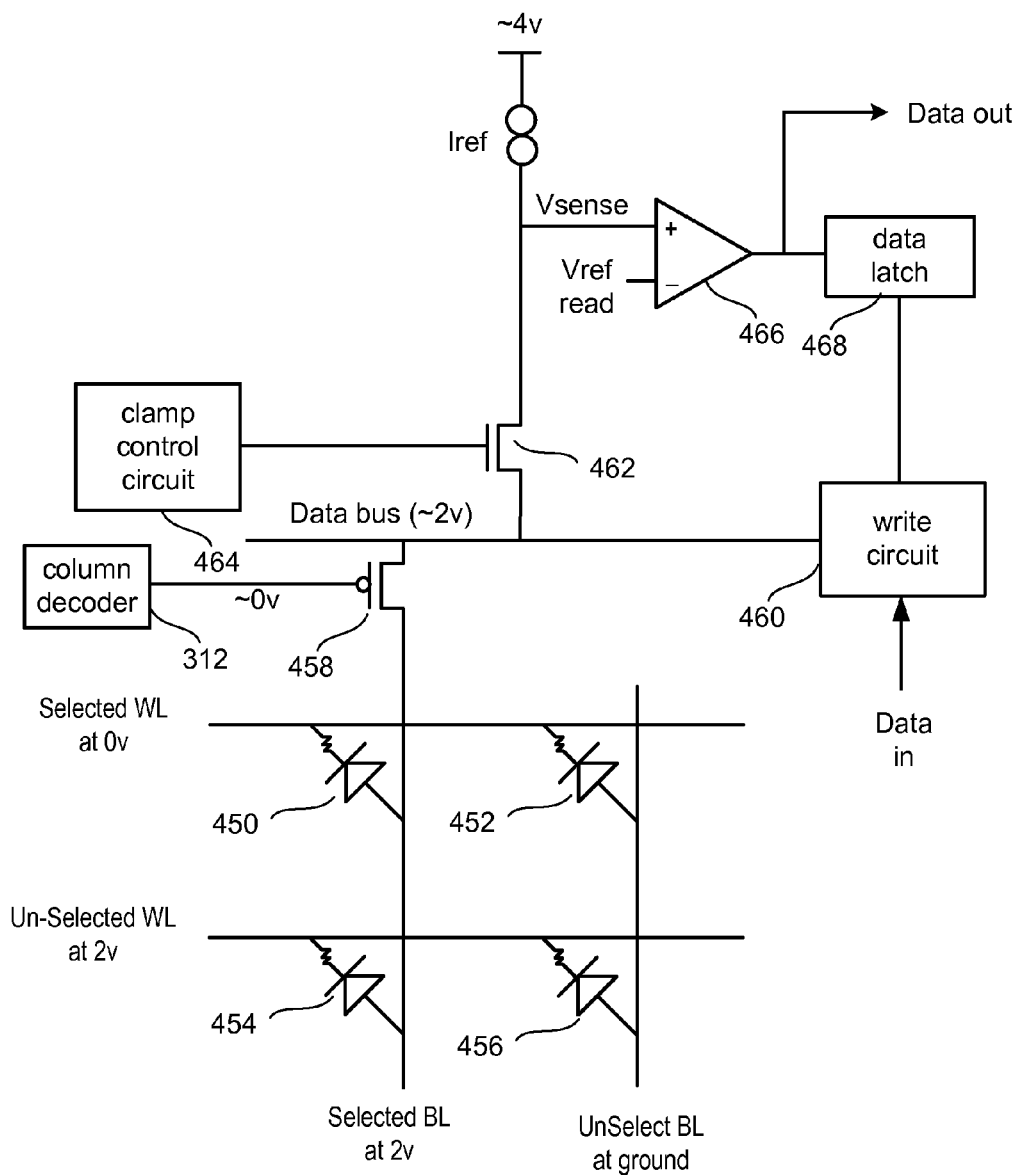
FIG. 7A depicts a circuit that can read the state of a memory cell.

FIG. 7A depicts a circuit that illustrates one embodiment for reading the state of a memory cell. FIG. 7A shows a portion of a memory array including memory cells 450, 452, 454 and 456, all of which are based on the embodiments of FIGS. 1-5. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply Iref. The output of comparator 466 is connected to a data out terminal (to system control logic 330, a controller and/or a host) and to data latch 468. Write circuit 460 is also connected to data latch 468.

When attempting to read the state of the reversible resistance-switching element, all word lines are first biased at Vread (e.g., approximately 2 volts) and all bit lines are at ground. The selected word line is then pulled to ground. For example purposes, this discussion will assume that memory cell 450 is selected for reading. One or more selected bit lines are pulled to Vread through the data bus (by turning on transistor 458) and the clamp device (transistor 462, which receives ~2 volts+Vt). The clamp device's gate is above Vread but controlled to keep the bit line near Vread. Current is pulled by the selected memory cell through transistor 462 from the Vsense node. The Vsense node also receives a reference current Iref that is between a high-resistivity state current and a low-resistivity state current. The Vsense node moves corresponding to the current difference between the cell current and the reference current Iref. Comparator 466 generates a data out signal by comparing the Vsense voltage to a Vref-read voltage. If the memory cell current is larger than Iref, the memory cell is in the low-resistivity state and the voltage at Vsense will be lower than Vref. If the memory cell current is smaller than Iref, the memory cell is in the high-resistivity state and the voltage at Vsense will be higher than Vref. The data out signal from comparator 466 is latched in data latch 468.

Looking back at FIG. 7, while in the high-resistivity state (see line 400), if the voltage VSET and sufficient current is applied, the reversible resistance-switching element will be SET to the low-resistivity state. Line 404 shows the behavior when VSET is applied. The voltage will remain somewhat constant and the current will increase toward Iset_limit. At some point, the reversible resistance-switching element will be SET and the device behavior will be based on line 402. Note that the first time the reversible resistance-switching element is SET, Vf (the forming voltage) is needed to SET the device. After that, VSET can be used. The forming voltage Vf may be greater than VSET.

While in the low-resistivity state (see line 402), if the voltage VRESET and sufficient current (Ireset) is applied, the reversible resistance-switching element will be RESET to the high-resistivity state. Line 406 shows the behavior when VRESET is applied. At some point, the reversible resistance-switching element will be RESET and the device behavior will be based on line 400.

In one embodiment, Vset is approximately 5 volts, Vreset is approximately 3 volts, Iset_limit is approximately 5 uA and the Ireset current could be as high as 30 uA.

If the current gets too high during a SET operation, it is possible for the reversible resistance-switching element to SET and then immediately RESET due to the high current. In some cases, the reversible resistance-switching element will oscillate between SET and RESET. Other unpredictable behavior may also occur. To prevent such a situation, technology is proposed herein for limiting the current during a SET operation in such a manner that the current can be as high as Iset_limit, but not high enough to cause an immediate RESET or oscillation.

One proposal for limiting the current during a SET operation is to SET the reversible resistance-switching element through a diode that is reverse biased. For example, looking at FIG. 5, it is proposed that diode 204 be reversed biased during a SET operation. That means that a higher voltage will be applied to conductor 208 then to conductor 206 to create the reverse bias between the p+ region 242 and the Titanium Nitride electrode 234. Because the diode is reverse biased, the current through the diode, and therefore the current through the reversible resistance-switching element, will be limited. In this embodiment, the diode is to be forward biased when the reversible resistance-switching element is RESET. This SET operation could also be used with the memory cell 200 in FIG. 1 as well as other cell structures by applying voltage polarities at the conductors which achieve the same polarity on the diode and the resistive switching element.

Figure 8:
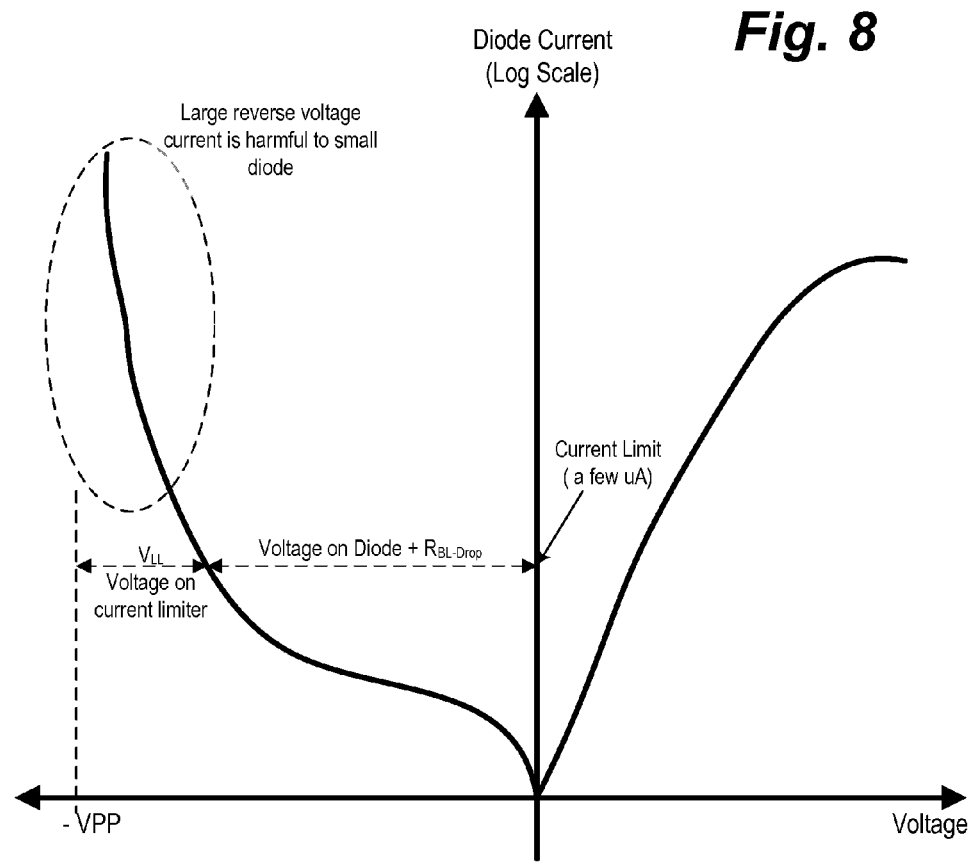
FIG. 8 is a graph depicting I-V characteristics of a diode in a log scale.

FIG. 8 shows the I-V characteristics (on a log scale) for diode 204. In the positive voltage range (forward bias), represented by the right side of the graph, the current quickly increases as the voltage increase. In the negative voltage range (reverse bias), the current increase is much lower until breakdown. A large current at reverse bias can damage the diode. Reverse bias is applied through a current limiting circuit that limits the current to prevent damage to the diode. The same current limit provides the before mentioned Iset_limit desired for the format or set operations.

In one embodiment, the diode is designed to have a low reverse soft breakdown voltage. Such a design can be accomplished by limiting the thickness of the region between the n+ and p+ regions.

Figure 9:
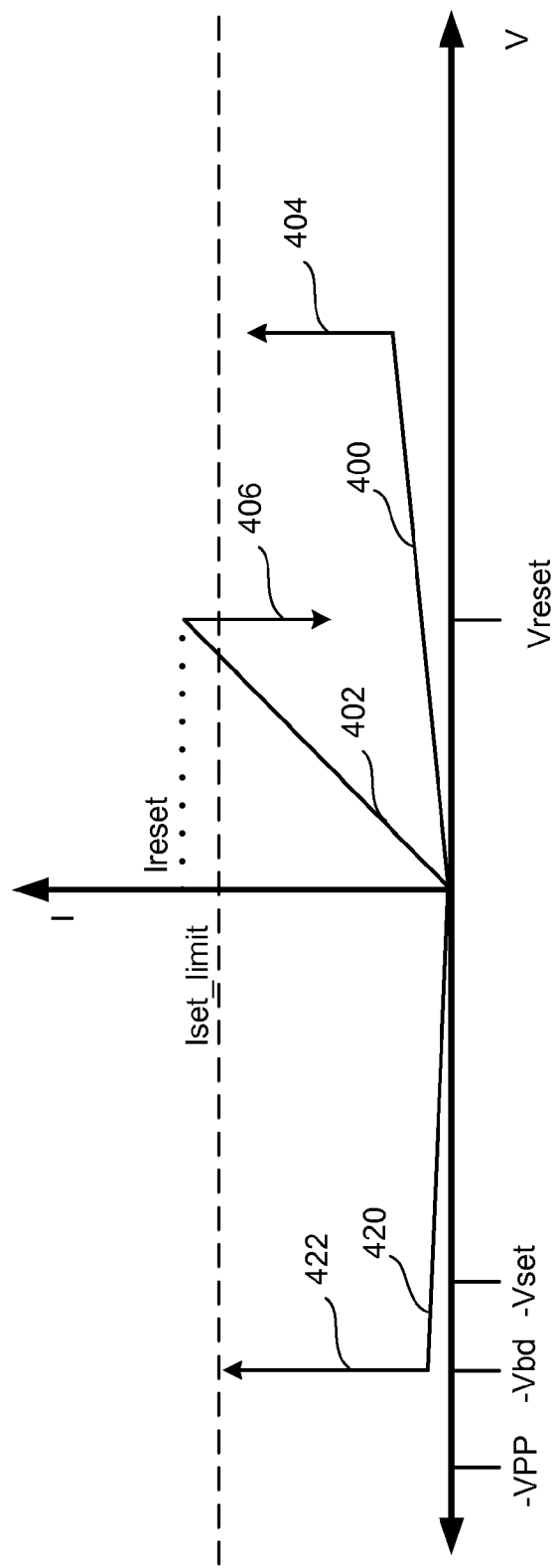
FIG. 9 is a graph depicting I-V characteristics of a reversible resistance-switching element and a diode.

FIG. 9 is a graph of voltage versus current for the metal oxide reversible resistance-switching element and the diode. Lines 400-406 are as discussed above. Line 420 represents the I-V characteristics of the diode during reverse bias. Line 422 shows the I-V characteristics of the diode at the breakdown voltage Vbd. Because the diode and the reversible resistance-switching element are connected in series, they will experience the same current. The device which has the lowest current will limit the current for the other device. As such, during forward bias, the memory cell comprising the diode and the reversible resistance-switching element will operate based on lines 400, 402 and 406. Resetting will be done by applying VRESET when in the low-resistivity state. When it is desired to SET the memory cell, the memory cell will be reverse biased and the memory cell will operate based on line 420 and line 422. When a voltage potential of Vset (e.g., −Vset) is applied across the reversible resistance-switching element, the current will try to rise. As the current increases, the reversible resistance-switching element will be SET. Because the diode is reverse biased, the current increase will be limited by the diode reverse current in soft breakdown, thereby, preventing an immediate RESET or oscillation between SET and RESET.

Figure 10:
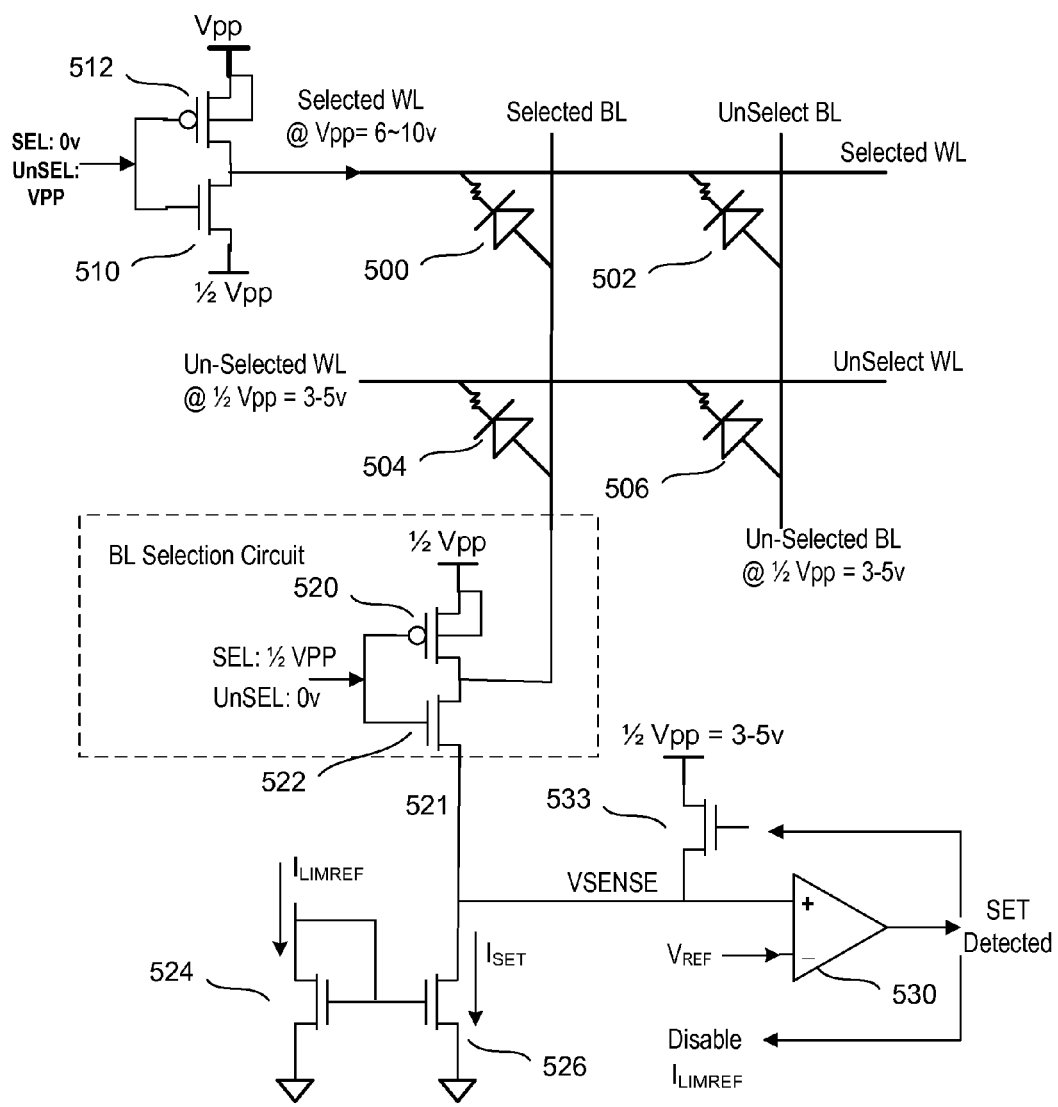
FIG. 10 is a schematic diagram of a circuit that can SET a memory cell.

FIG. 10 is a schematic diagram of a circuit for SETTING a memory cell. FIG. 10 shows four memory cells 500, 502, 504 and 506, each of which includes a diode and a reversible resistance-switching element. In a full array, there would be much more than four memory cells. In one embodiment, the memory cells are based on the embodiment of FIG. 5. In another embodiment, the memory cell of FIG. 1 can be used. Either way, the structures of FIG. 2, 3 or 4 can be used.

Memory cell 500 of FIG. 10 is selected for setting, as it is at the intersection of the selected word line and the selected bit line. Each word line will have a driver circuit, represented by transistors 510 and 512 connected between VPP and ½ VPP. In one embodiment, VPP (approximately 6-10 volts) is the highest voltage available on the integrated circuit. By applying 0 volts to the gates of transistors 510 and 512, VPP will be driven on a selected word line. By applying VPP to the gates of transistors 510 and 512, ½ VPP will be driven on an unselected word line. If a bias near ground is applied to the selected bit line and VPP is applied to the selected word line, the diode of memory cell 500 will be reverse biased beyond the reverse breakdown voltage of the diode and the selected cell can be SET. If a bias near ground is applied to the selected bit line and ½ VPP is applied to a word line, there will not be a sufficient voltage differential to SET the memory cell.

A BL Selection Circuit comprises connected transistors 520 and 522. There will be one BL Selection Circuit for each bit line or a set of BL Selection Circuits that can be switchably connected to different subsets of bit lines. If 0 volts is applied to the gate of transistors 520 and 522, then ½ VPP is driven on an unselected bit line. For a selected bit line, ½ VPP is applied to the gate of transistors 520 and 522 so that the bit line is pulled to a bias near ground by node 521 and current (representing the current through the selected memory cell) is passed to node 521.

Node 521 is connected to a current mirror that comprises transistors 524 and 526 connected at their gates. Another circuit (not depicted in FIG. 10) supplies a reference current $I_{LIMREF}$. In one embodiment, $I_{LIMREF}$ is equal to Iset_limit. In another embodiment, $I_{LIMREF}$ is indicative of Iset_limit. The current $I_{SET}$, which flows through transistor 526, will mirror $I_{LIMREF}$. If the current at node 521 approaches $I_{SET}$, the voltage at node 521 (labeled as VSENSE) will increase. The voltage VSENSE is provided to comparator 530, which compares VSENSE to $V_{REF}$. When VSENSE equals $V_{REF}$, the output of comparator 530 will indicate that a SET operation has been detected. The reference voltage $V_{REF}$ is set so that it represents a value of VSENSE that corresponds to the memory cell current through device 522 being equal to (or slightly above) Iset_limit. This circuit assumes that the current will approach Iset_limit when the memory cell SETs; therefore, this condition is detected by comparator 530. The output of comparator 530 is used to disable the circuit that generates $I_{LIMREF}$ and unselect the bit line by providing a signal to the gate of transistor 533 in order to force ½ VPP on to the bit line.

Figure 11:
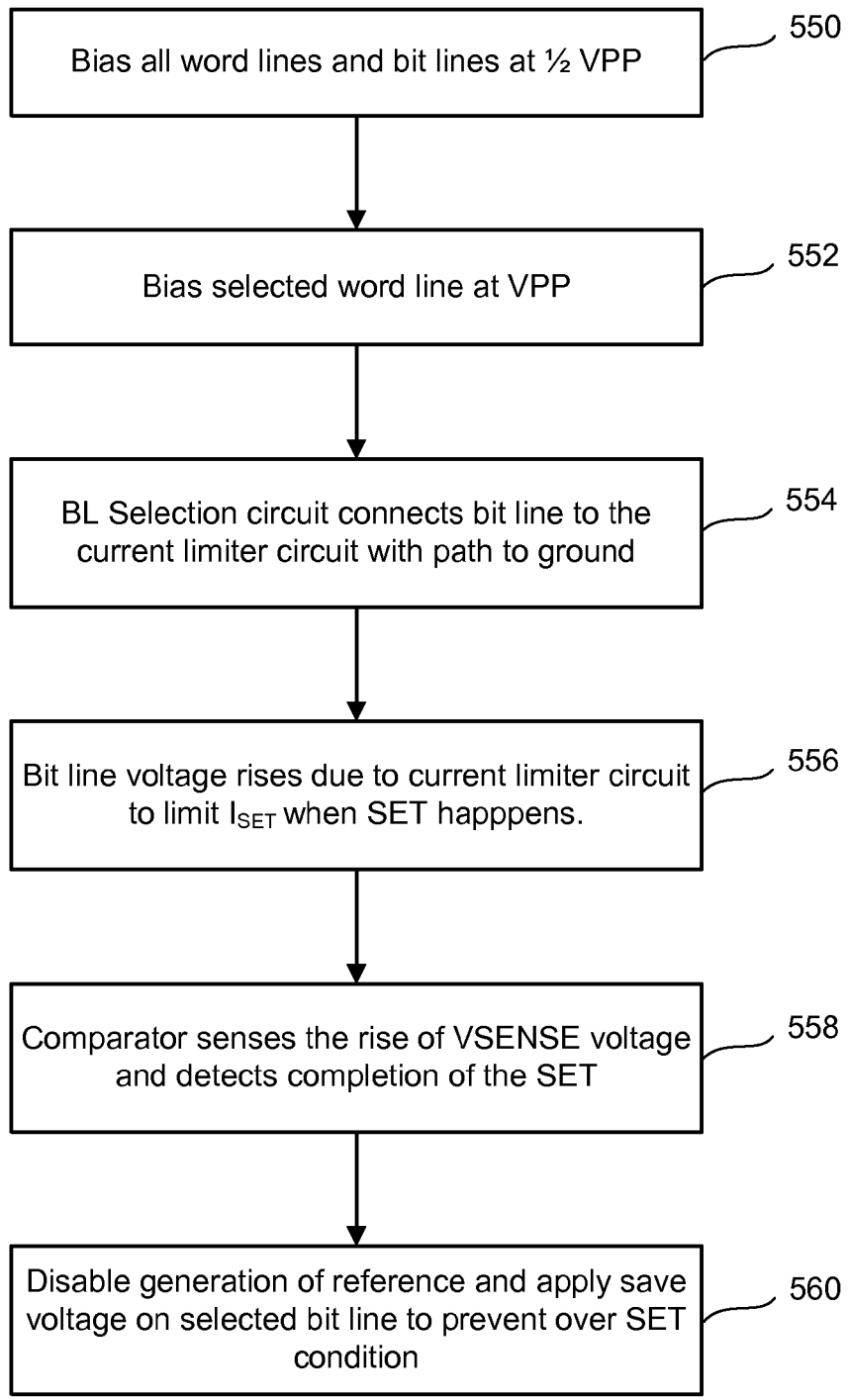
FIG. 11 is a flow chart describing one embodiment of a process for operating the circuit of FIG. 10.

FIG. 11 is a flow chart describing the behavior of the circuit of FIG. 10 during a SET operation. In step 550, all word lines and all bit lines are biased at ½ VPP. In step 552, the selected word line is biased at VPP, for example, by applying 0 volts to the gate of transistors 510 and 512. The voltage VPP is sufficient to cause a reverse current through the diode of one uA or more and still have a voltage across the resistor material of almost 2 volts. In another embodiment, the selected word line is biased to a voltage that is at least a diode drop higher than the voltage on the unselected word lines. In step 554, the BL Selection Circuit connects the selected BL to the current limiter circuit (current mirror and comparator 530) with a path to ground. As such, the selected bit line falls sufficiently to provide a sufficient voltage differential that will SET the reversible resistance-switching element of the selected memory cell. In step 556, the bit line voltage rises when the SET occurs, due to the current-limit circuit. In step 558, comparator 530 detects that VSENSE has risen to the Vref, thereby detecting the SET operation. In step 560, the output of comparator 530 is used to disable the generation of $I_{LIMREF}$ and to apply the "save" voltage of ½ VPP to the bit line to prevent the memory cell from being over-SET (e.g., causing an immediate RESET or oscillation between RESET and SET). The process of FIG. 11 can be performed for one memory cell or in parallel for multiple memory cells. Another embodiment includes an implementation where the selected word line is at ground and the selected BL has a path to a voltage at least a diode drop above the ½ VPP.

Figure 12:
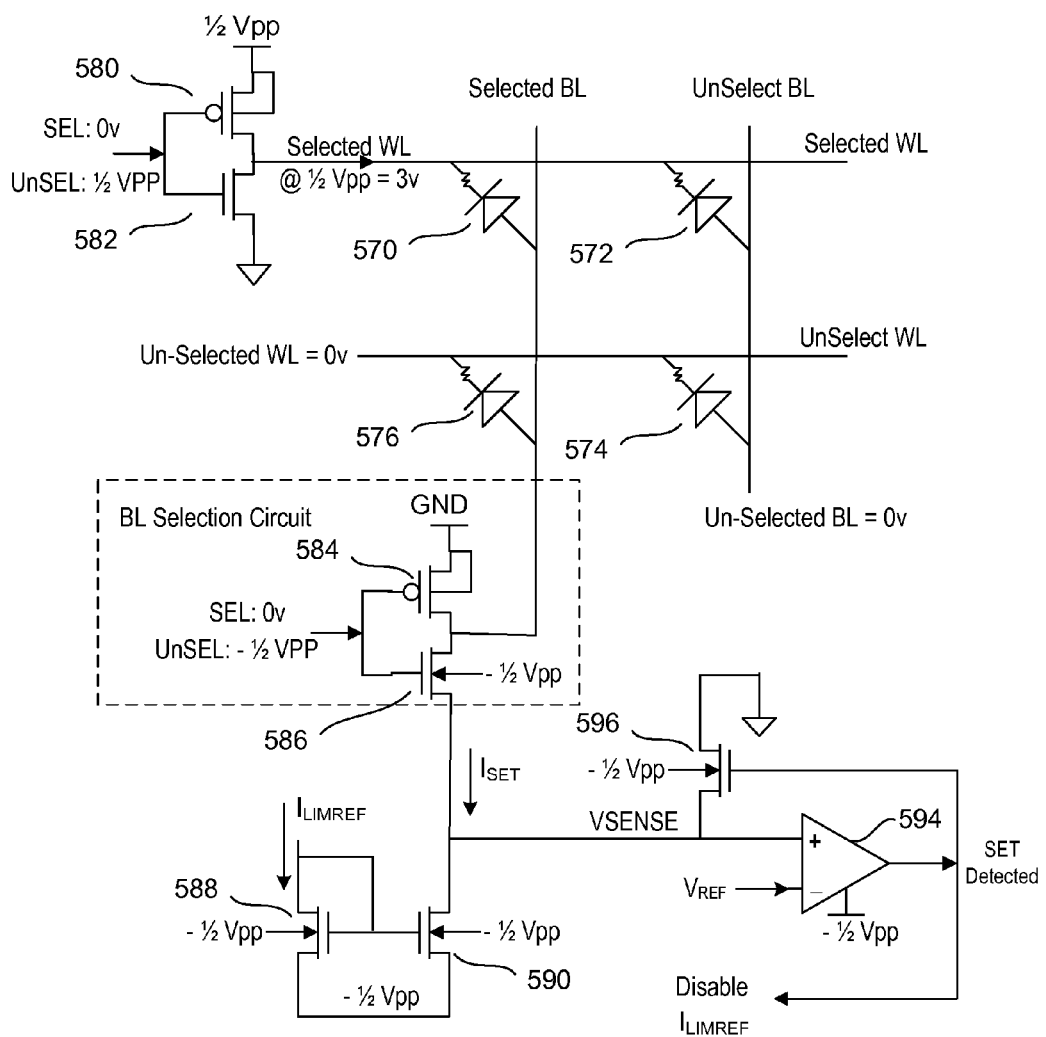
FIG. 12 is a schematic diagram of a circuit that can SET a memory cell.

FIG. 12 is a schematic diagram of a second embodiment of a circuit for setting a memory cell. The difference between the circuits of FIG. 12 and FIG. 10 is that the circuit of FIG. 12 uses triple well technology. That is, by placing an nmos transistor in a p-well (where the p-well is in an n-well that is in a p-substrate), negative voltages can be used. The use of negative voltages allows all voltages to be reduced by ½ VPP. This arrangement saves power and causes less stress on the circuit.

In one embodiment, the memory cells can be read before performing a SET operating. Then, only those memory cells that are supposed to be SET and that are in the high-resistivity state will be SET. Memory cells that are supposed to be SET, but are in the low-resistivity state will not need to be SET.

FIG. 12 shows four memory cells 570, 572, 574 and 576, each of which includes a diode and a reversible resistance-switching element. Memory cell 570 is selected for setting, as it is at the intersection of the selected word line and the selected bit line. Each word line will have a driver circuit, represented by transistors 580 and 582 connected between ½ VPP and ground. By applying 0 volts to the gate of transistors 510 and 512, ½ VPP will be driven on a selected word line. By applying ½ VPP to the gate of transistors 580 and 582, 0 volts will be driven on an unselected word line. If a bias near −½ VPP volts is applied to the selected bit line and ½ VPP is applied to the selected word line, the diode of memory cell 570 will be reverse biased beyond its reverse breakdown voltage and the cell 570 will be SET. If a bias near −½ VPP volts is applied to the selected bit line and 0 volts is applied to a word line, there will not be a sufficient voltage differential to SET the memory cell.

The BL Selection Circuit comprises connected transistors 584 and 586. There will be one BL Selection Circuit for each bit line or a set of BL Selection Circuits that can be switchably connected to different subsets of bit lines. If −½ VPP is applied to the gate of transistors 584 and 586, then 0 volts is driven on an unselected bit line. For a selected bit line, 0 volts is applied to the gate of transistors 584 and 586 so that the bit line is pulled to a bias near −½ VPP by device 590 and current (representing the current through the selected memory cell) is passed to the current limiting circuit.

Transistor 586 is connected to a current mirror that comprises transistors 588 and 590 connected at their gates. Another circuit (not depicted in FIG. 12) supplies a reference current $I_{LIMREF}$. If the current out of transistor 586 approaches $I_{SET}$, the voltage at node 521 (labeled as VSENSE) will increase. The voltage VSENSE is provided to comparator 594, which compares VSENSE to $V_{REF}$. When VSENSE equals $V_{REF}$, the output of comparator 594 will indicate that a SET operation has been detected, the generation of the reference current $I_{LIMREF}$ will be disabled and the bit line will be pulled to ground.

The circuit of FIG. 12 operates similar to the circuit of FIG. 10, with different voltage levels being used (as noted above). As such, the flow chart of FIG. 11 applies to the circuit of FIG. 12, with some changes in voltages For example, in step 550 the word lines and bit lines are biased at 0 volts. In step 552, the selected word line is biased at ½ VPP. In step 554, the bit line is connected to the current limiter circuit with a path to −½ VPP. The voltage across the selected memory cells is VPP (−½ VPP to +½ VPP).

SET Using Capacitive Discharge

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied as a pulse. The Vset pulse will be shorter then the time needed to SET the reversible resistance-switching element so that the charge from the bit line and data bus will be needed to provide the extra charge not provided by the Vset pulse. In some implementations, the SET operation can be followed by a verify operation to see if the SET operation was successful. If not, the SET operation can be retried.

Figure 13:
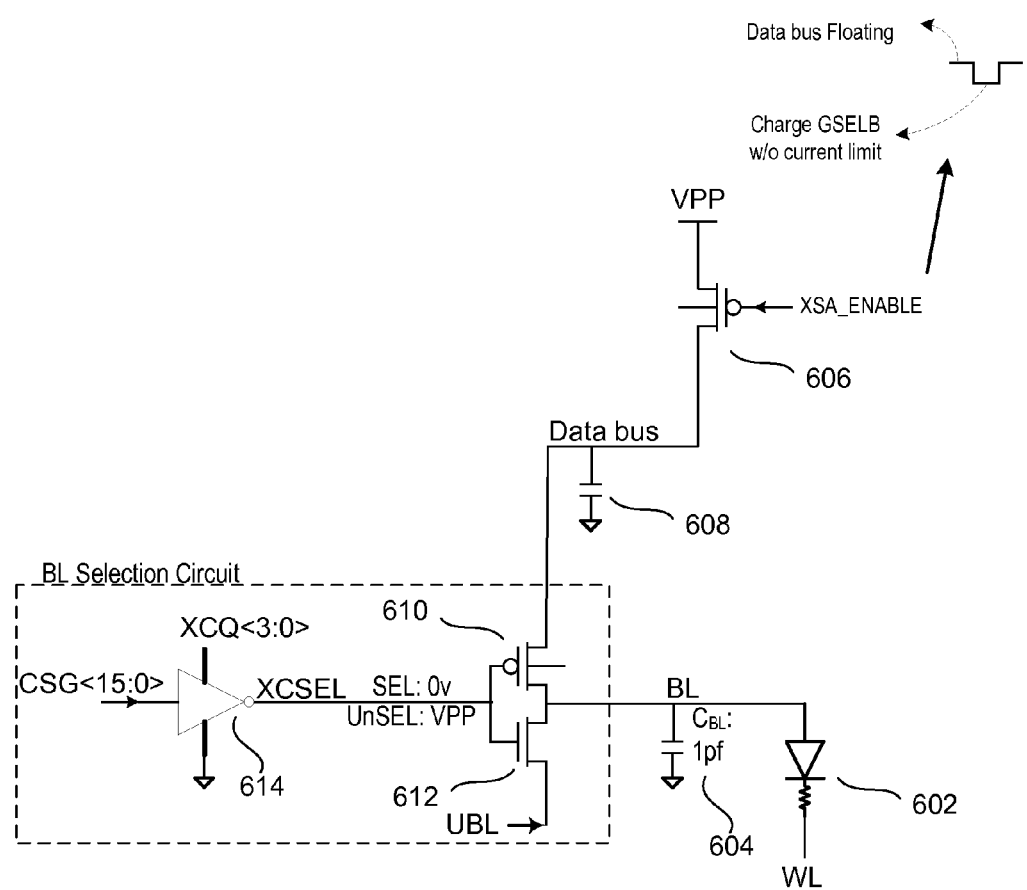
FIG. 13 is a schematic diagram of a circuit that can SET a memory cell.

FIG. 13 is a schematic diagram of one embodiment of a circuit that can be used to set a memory cell using the capacitive discharge described above. In some embodiments, there will be one such circuit for each bit line or a group of such circuits that can be selectively connected to different groups of bit lines.

The circuit of FIG. 13 includes a memory cell 602 that comprises a reversible resistance-switching element and a diode, as described above with respect to FIGS. 1-5. Memory cell 602 is connected to a bit line BL having a capacitor 604. In one embodiment, capacitor 604 is about 1 pf. The bit line BL is connected to a Data bus via the BL Selection Circuit. In one embodiment, the each bit line has its own BL selection circuit, and each bit line has its own Data bus line. The control circuitry for the memory system sends column selection signals CSG<15:0> and XCQ<3:0> to the various BL Selection Circuits to identify which bit lines should connect to the Data bus. An appropriate one of the signals CSG<15:0> is provided to the input of inverter 614 and an appropriate one of the signals XCQ<3:0> is provided to the power pin of inverter 614 so that the output XCSEL of inverter 614 will be 0 volts when the associated bit line BL is selected; otherwise, XCSEL of inverter 614 will be VPP. The signal XCSEL is provided to the gates of transistors 610 and 612. When XCSEL of inverter 614 is at VPP, the unselected bit line voltage UBL of 0.7 volts (approximately one diode drop) is provided to the bit line via transistor 612. When XCSEL of inverter 614 is at 0 volts, the Data bus is connected to the bit line via transistor 610. The Data bus, which includes parasitic capacitance 608, is connected to transistor 606. The gate of transistor 606 receives a pulse. Between pulses, the Data bus is floating. During the pulse (a negative pulse), VPP is provided to the Data bus (via transistor 606) to charge-up the data bus parasitic capacitance 608. When the BL selection circuit is selected, the charge from the Data bus charges the bit line BL and its capacitance 604. When the path to VPP is shut off, the bit line is floating and the charge on the bit line BL (and capacitor 604) will discharge though memory cell 602. In one embodiment, the diode is forward biased and only positive voltages are used.

Figure 14:
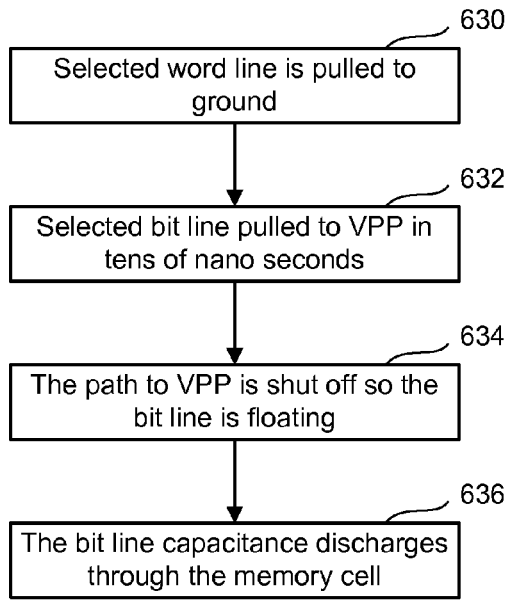
FIG. 14 is a flow chart describing one embodiment of a process for operating the circuit of FIG. 13.

FIG. 14 is a flow chart of one embodiment of a process for operating the circuit of FIG. 13. The process of FIG. 14 can be performed on one memory cell or on multiple memory cells concurrently. In step 630, the selected word line is pulled to ground. The unselected word lines are at VPP-.7v. In step 632, the selected bit line is pulled to VPP. This can be accomplished in tens of nano seconds by applying the depicted pulse (XSA_ENABLE) to the gate of transistor 606 and the appropriate selection signals CSG<15:0> and XCQ<3:0>. Unselected bit lines are at 0.7 volts. In step 634, the path to VPP is shut off due to the pulse (XSA_ENABLE) being over. Thus, the data bus and the bit line are floating. While the bit line was at VPP in step 634, the reversible resistance-switching element of the memory cell was receiving a sufficient voltage to perform a SET operation. However, the duration of the application of VPP was not long enough to cause a SET. In one embodiment, the reversible resistance-switching element needs hundreds of nano seconds to SET; however, VPP is only provided for tens of nano seconds. Because the path to VPP is shut off, in step 636 the bit line capacitance (and in some embodiments, depending on operation of the selection signals, the data bus capacitance) is dissipated through the memory cell, including the reversible resistance-switching element. The extra charge from dissipating the capacitive charge may be enough to finish the SET operation.

Figure 15:
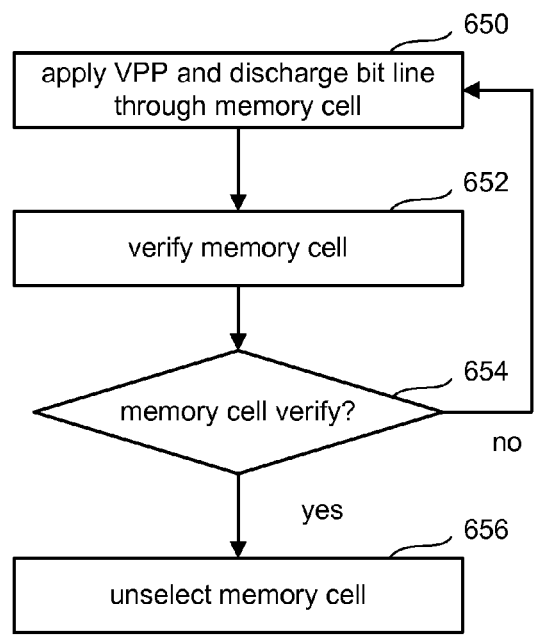
FIG. 15 is a flow chart describing one embodiment of a process for repeating the application of a SET voltage in order to SET a memory cell.

In some embodiments, it is possible that the extra charge from dissipating the capacitive charge is not enough to finish the SET operation. Therefore, in some implementations, the process of FIG. 15 is used to perform a SET of a memory cell. In step 650 of FIG. 15, the process of FIG. 14 is performed. In step 652, a verify operation is performed to see if the memory cell is SET. In one embodiment, a read voltage (less than Vreset) is applied. Based on the current sensed through the memory cell, the control circuitry determines whether the reversible resistance-switching element is in a high-resistivity state or low-resistivity state. If the memory cell verifies to be in the low-resistivity state (see step 654), then in step 656 the memory cell is unselected from the SET process. If the memory cell does not verify to be in the low-resistivity state (see step 654), then the process loops back to step 650 and repeats. Note that the process of FIG. 15 can be used with the other procedures described herein to SET or RESET a memory cell.

The capacitive discharge method described above limits the maximum electrical charge that flows through the memory cell in the SET operation. The maximum electrical charge in the SET is dependent on the voltage on the bit line applied before the SET and the capacitance on the bit line (and optionally the data bus which is connected to the bit line). The maximum electrical charge is insensitive to the resistance of the diode in the memory cell. This leads to a higher Ron after the SET operation. A higher Ron leads to a lower Ireset, the current required to reset the reversible resistance-switching element. The diode can provide that Ireset because the bit line is held at a sufficient voltage during the RESET operation.

As described above, the selected bit line is charged and isolated by turning on and off a pre-charge device (transistor 606) connected to the data bus which is thereby connected to the selected bit line. Another improvement to the method of FIG. 14 is to detect the increase in current through the memory cell when it SETs and using that detecting to deselect the bit line. The column decoder circuitry then pulls the bit line down to a deselected level more quickly than the discharge though the cell further reducing the time current flows through the cell.

Figure 16:
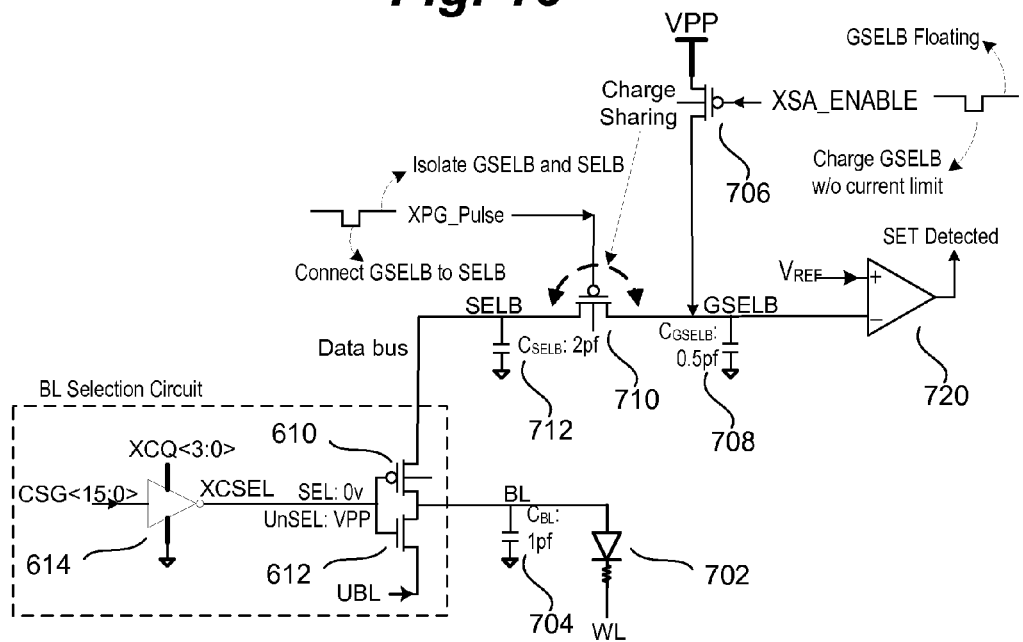
FIG. 16 is a schematic diagram of a circuit that can SET a memory cell.

FIG. 16 is a schematic diagram of another embodiment of a circuit that can be used to set a memory cell using the capacitive discharge described above. In some embodiments, there will be one such circuit for each bit line or a group of such circuits that can be selectively connected to different groups of bit lines.

In some embodiments, it is desirable to select the word line first because in some monolithic three dimensional memory arrays the word line selection is slow. The charge may be placed on the bit line capacitance very quickly by charge sharing as illustrated in FIG. 16. An additional capacitor is charged to the highest voltage available in the circuitry during a pre-charge time. Then, the bit line is selected and a charge sharing device 710 is turned on to connect this capacitor to the bit line. The connected capacitors quickly reach a desired voltage for the SET operation determined by the capacitance ratio, and then the charge sharing device is shut off. The SET operation occurs after the bit line receives the charge transfer because it takes a longer time to SET the reversible resistance-switching element than to transfer the charge.

The circuit of FIG. 16 includes a memory cell 702 that comprises a reversible resistance-switching element and a diode, as described above with respect to FIGS. 1-5. Memory cell 702 is connected to a bit line BL having a capacitance 704. In one embodiment, capacitance 704 is 1 pf. The bit line BL is connected to a Data bus via the BL Selection Circuit. In one embodiment, the each bit line has its own BL selection circuit, and many Bit lines can be connected to a multi-line Data Bus. The BL selection circuit of FIG. 16 is identical to the bit line selection circuit of FIG. 13.

The Data bus is connected to the bit line via transistor 610. The Data bus, which comprises capacitance 712 (e.g. 2 pf), is connected to transistor 710 which controls the charge sharing. The gate of transistor 710 receives a pulse (XPG_PULSE). Between pulses, the Data bus (node SELB) is floating and isolated from node GSELB. During the pulse (a negative pulse), the data bus (node SELB) is connected to GSELB. Capacitor 708 (e.g. 0.5 pf) is connected to ground from GSELB.

Transistor 706, which is connected to VPP and to GSELB, receives a pulse (XSA_ENABLE). Between pulses, GSELB is floating. During a negative pulse, VPP is used to charge GSELB without a current limit. When transistor 710 receives a pulse at its gate, the charge at GSELB is used to charge SELB to (VPP)×(Capacitance of Data bus)/(Capacitance of Data bus+Capacitance of GSELB). The charge at SELB is then transferred to the bit line, similar to as described for FIG. 13.

The circuit of FIG. 16 also includes a comparator 720 which compares the voltage at GSELB with a reference Vref. When the comparator senses the discharge of the data bus and bit line, it concludes that a SET has successfully occurred and outputs a SET detection signal indicating that the memory cell has been SET. The output of comparator 720 is provided to the control logic for the memory system.

Figure 17:
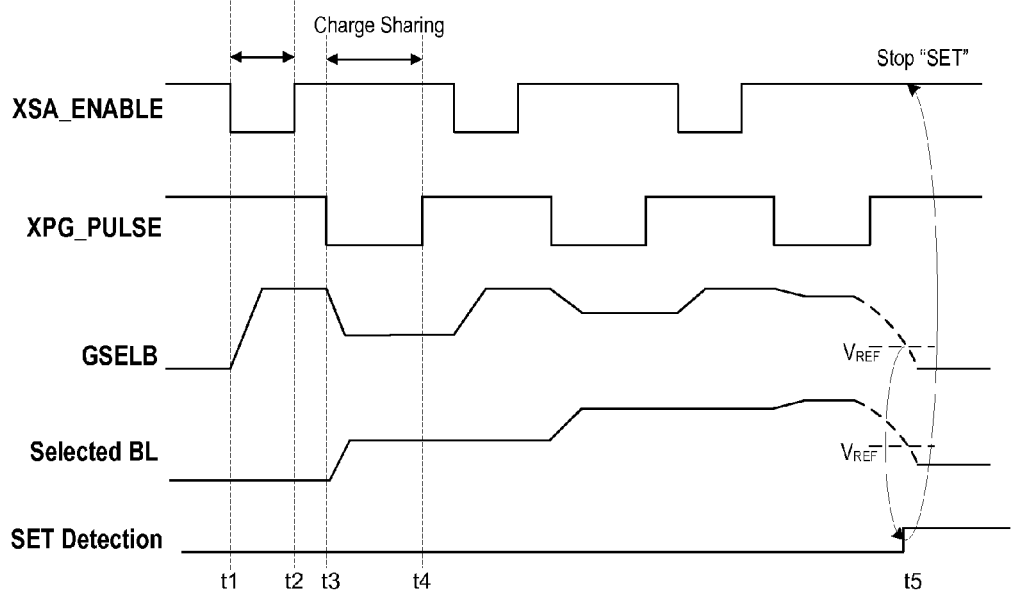
FIG. 17 is a timing diagram that describes one embodiment of a process for operating the circuit of FIG. 16.

FIG. 17 is a timing diagram that explains various embodiments for operating the circuit of FIG. 16. Between t1 and t2, a pulse is applied to transistor 706 by the signal XSA_ENABLE. This charges GSELB without a current limit, as depicted. Between t3 and t4, a pulse is applied to transistor 710 by the signal XPG_PULSE. This cause the charge to be shared with SELB. The BL Selection circuit allows that charge to be shared with the bit line, as depicted in FIG. 17. In some cases, this one iteration will cause the memory cell to be SET. In other embodiments, multiple iterations of the two pulses (charging GSELB and charge sharing) will be used to increase the charge on the bit line until the memory cell is set (see t5).

Figure 18:
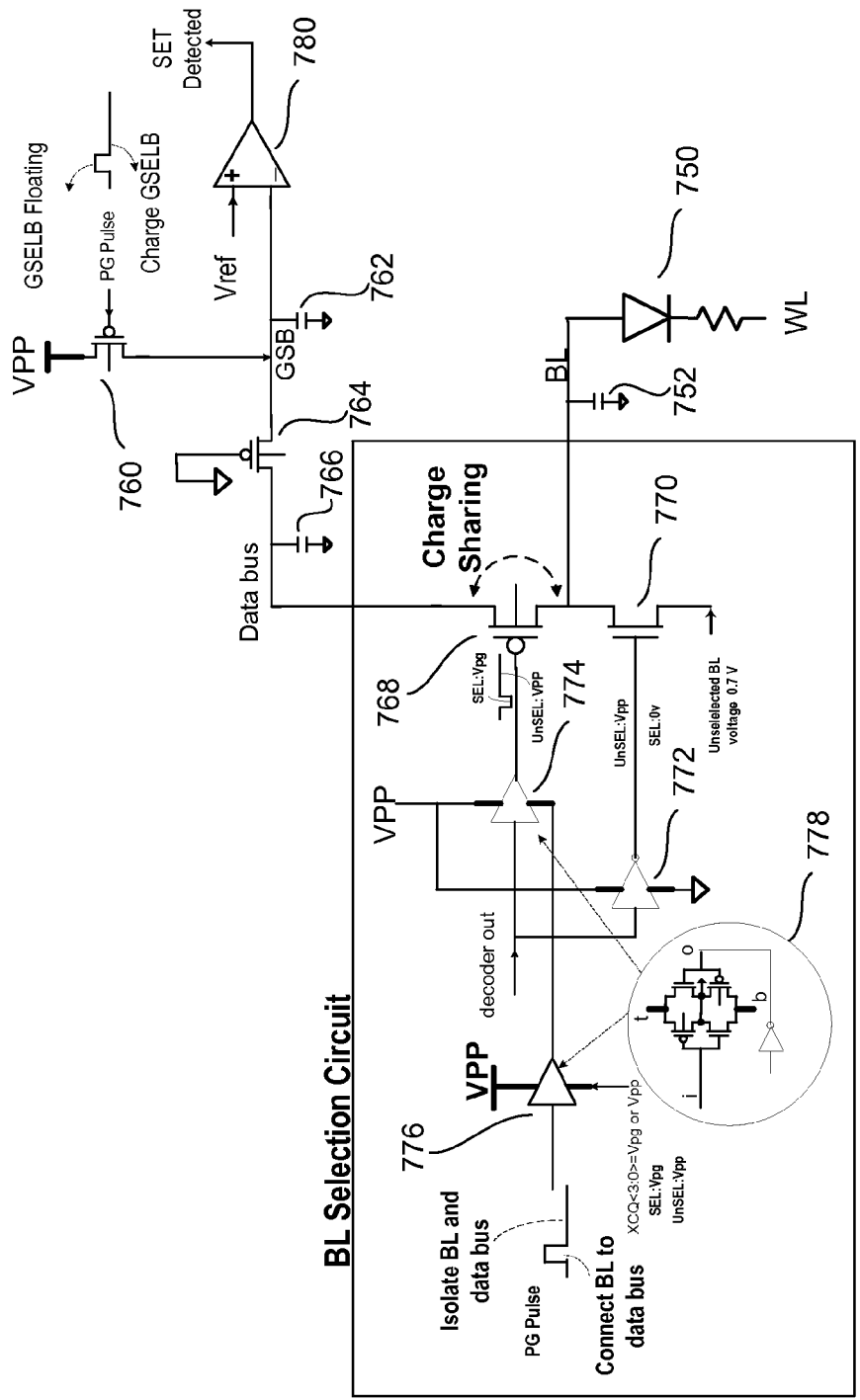
FIG. 18 is a schematic diagram of a circuit that can SET a memory cell.

FIG. 18 is a schematic diagram of another embodiment of a circuit that can be used to set a memory cell using the capacitive discharge described above. In some embodiments, there will be one such circuit for each bit line or a group of such circuits that can be selectively connected to different groups of bit lines. In the circuit of FIG. 18, the bit line selection device is turned off before the memory cell is switched into the new state.

The circuit of FIG. 18 includes a memory cell 750 that comprises a reversible resistance-switching element and a diode, as described above with respect to FIGS. 1-5. Memory cell 750 is connected to a bit line BL having a capacitance 752. The bit line BL is connected to a Data bus via the BL Selection Circuit. In one embodiment, the each bit line has its own BL selection circuit, and many bit lines can be connected to a multi-line Data bus.

The Data bus, which includes a capacitance 766, is connected to node GSB via transistor 764, which has its gate connected to ground. Node GSB is connected to comparator 780, which operates like comparator 720 of FIG. 16. The output of comparator 780 is provided to the control logic for the memory system. Transistor 760, which is connected to VPP and to GSB, receives a pulse (PG Pulse). During a pulse, GSB is floating. Between pulses, VPP is used to charge GSB, which charges the Data bus. Based on the selection signals XCQ<3:0> and "decoder out" the BL Selection Circuit shares the charge on the data bus with the selected bit line in order to SET memory cell 750 as discussed above.

The BL Selection Circuit of FIG. 18 includes transistor 768, transistor 770, inverter 772, pass gate 774 and pass gate 776. Circle 778 provide the details (four internal transistors and inverter) of pass gates 774 and 776. The pass gates have an input (i), output (O), top node (t) and bottom node (b). If the input (i) is a positive voltage, the output (O) receives the signal at the bottom node (b). If the input (i) is a negative or zero voltage, the output (O) receives the signal at the top node (t). Pass gate 776 receives PG Pulse (same as what is received by transistor 760). During a pulse (positive voltage), the appropriate one of XCQ<3:0>, which is input at the bottom node of pass gate 776, is provided at the output of pass gate 776 and transferred to the output of pass gate 774 if "decoder out" is also selecting the bit line with a positive voltage. The appropriate one of XCQ<3:0> will be at Vpg (voltage used to SET) for the selected bit line and at VPP for the unselected bit line. When the gate of transistor 768 receives VPP, it cuts off the bit line from the Data bus. When the gate of transistor 768 receives Vpg, it shares the charge on the Data bus with the bit line. Note that the gate voltage (Vpg) of transistor 768 can bet set to control the transient current by trim-options.

Between pulses input to pass gate 776, VPP will be transferred to the output of pass gate 776 and to the output of pass gate 774, which is then provided to the gate of transistor 768 to cut off the bit line from the Data bus. If XCQ<3:0> or "decoder out" is also selecting the bit line, then VPP will be passed to the gate of transistor 768 to cut off the bit line from the Data bus.

Figure 18A:
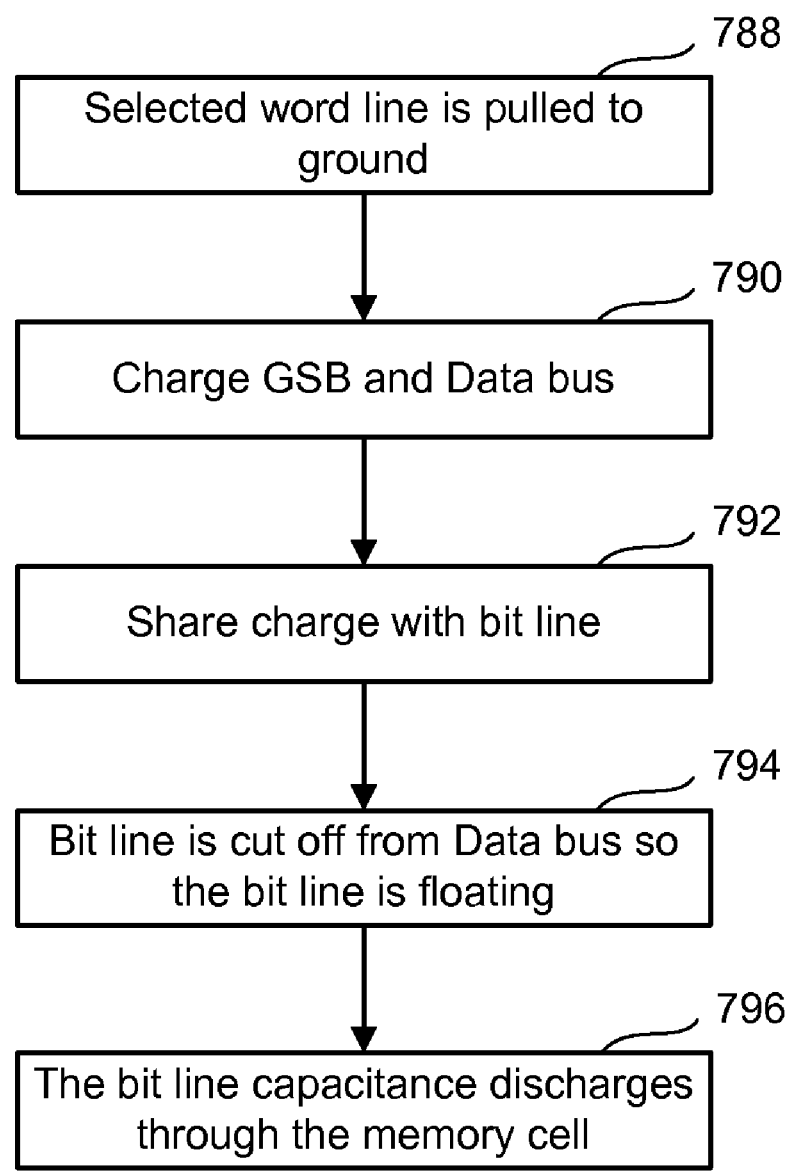
FIG. 18A is a flow chart describing one embodiment of a process for operating the circuit of FIG. 18.

FIG. 18A is a flow chart describing one embodiment of the operation the circuit of FIG. 18. In step 788, the selected word line is pulled to ground. In step 790, node GSB and the data bus are charged, as explained above by transferring VPP to node GSB between pulses of PG Pulses. In step 792, the charge on the data bus is shared with the bit line by connecting the bit line to the data bus using the BL Selection circuit, as described above. In step 794, the bit line is cut off from the data bus, thereby floating the bit line. As a result, the bit line discharges through memory cell 750 in step 796. In some embodiments, one iteration of the process of FIG. 18A is enough to SET the memory cell. In other embodiments, multiple iterations are needed to SET the memory cell (see, for example, the processes of FIG. 17 or FIG. 15).

The circuits of FIGS. 13, 16 and 18 limit the amount of electrical charge in the SET operation rather then the SET current.

Pulse Reset

In previous embodiments, the reversible resistance-switching element is RESET by applying Vreset and providing for a large current through the reversible resistance-switching element. In memory cells that use a diode as the steering element, it is possible during such a RESET operation to experience some oscillation between SET and RESET or fail to provide a sufficiently large current. One solution proposed herein is to perform a RESET by applying a voltage equal to or higher then the SET voltage for a short pulse time (on the order of tens of nano seconds). The pulse is shorter than necessary for a SET operation, but long enough for a RESET operation or a RESET operation broken into multiple pulses. This guarantees that no SET operation can occur and, therefore, no oscillating between SET and RESET. After applying the short pulse, the memory cell can be verified to see whether it has been RESET. If not, another pulse can be applied. This process can repeat until the memory cell is RESET. In one embodiment, the diode is forward biased during the RESET and only positive voltages are used.

In some embodiments, the SET voltage is greater than or equal to the RESET voltage. In other embodiments, the RESET voltage is greater than or equal to the SET voltage.

Figure 19:
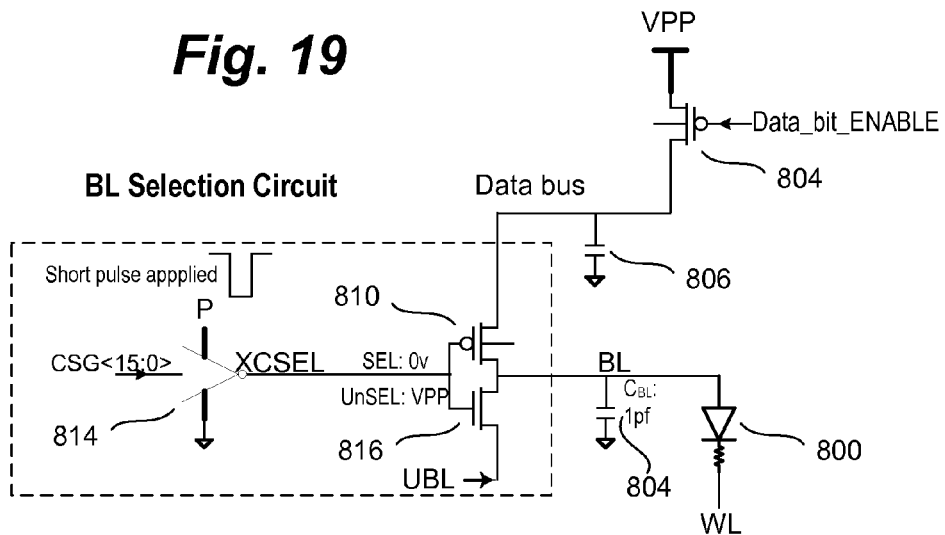
FIG. 19 is a schematic diagram of a circuit that can RESET a memory cell.

FIG. 19 provides one embodiment of a circuit that can perform a RESET using the short pulses described above. The circuit of FIG. 19 includes a memory cell 800 that comprises a reversible resistance-switching element and a diode, as described above with respect to FIGS. 1-5. Memory cell 800 is connected to a bit line BL having a capacitance 802. In one embodiment, capacitance 802 is 1 pf. The bit line BL is connected to a Data bus via the BL Selection Circuit. In one embodiment, the each bit line has its own BL selection circuit, and many bit lines can be connected to a multi-line Data Bus.

The BL selection circuit of FIG. 19 includes transistor 810, transistor 816 and inverter 814. Inverter 814 receives an appropriate one of selection signals CSG<15:0> at its input. In one embodiment, CSG<15:0> is a 16 bit bus coming from a decoder. The top power input to inverter 814 receives a short pulse P from a memory system control circuitry. This pulse regulates and causes the short RESET pulse discussed above. During that pulse P, the inverted value of the appropriate one of selection signals CSG<15:0> is provided at the output (XCSEL) of inverter 814 and provided to the gate of transistors 810 and 816. Therefore, if the bit line is selected, 0 volts will be applied to the gate of transistors 810 and 816 during a pulse P. If the bit line is not selected, VPP will be applied to the gate of transistors 810 and 816 during a pulse P. Between pulses, VPP will be provided the gate of transistors 810 and 816. When 0 volts is applied to the gate of transistor 810, the bit line BL will be in communication with the Data bus via transistor 810. When VPP is applied to the gate of transistors 810 and 816, the unselected bit line voltage UBL will be applied to the bit line via transistor 816. In one embodiment, UBL is ground.

The Data bus is connected to capacitance 806 and transistor 804. When the Data_bit_ENABLE signal applied to the gate of transistor 804 is low (enabled), then VPP is provided to the Data bus via transistor 804. Therefore, when transistor 810 allows the Data bus to communicate with the bit line, the bit line will be at VPP. When transistor 810 cuts off the bit line from the data bus, the bit line will be pulled to 0 volts by device 816. As such, the bit line will see a short pulse equal in duration, but opposite in polarity, to the pulse P. The control circuitry will provide the pulse P so that it is too short to cause a SET. One or more pulses should cause a RESET.

Figure 20:
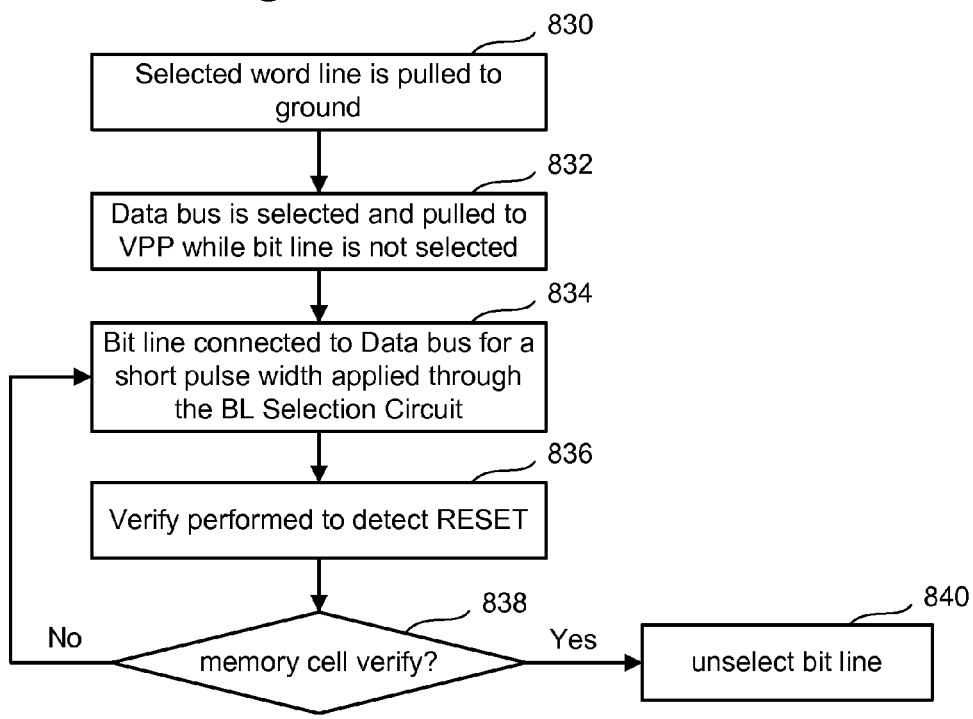
FIG. 20 is a flow chart describing one embodiment of a process for operating the circuit of FIG. 19.

FIG. 20 is a flow chart describing one embodiment of a process for operating the circuit of FIG. 19. In step 830, the selected word line is pulled to ground. The unselected word lines are held at Vpp minus 0.7 Volts. In step 832, the Data bus is selected and pulled to VPP by appropriately asserting Data_bit_Enable. The bit lines all remain at a low voltage (e.g., 0 volts). In step 834, the bit line is connected to the Data bus for a short pulse which is applied though the BL Selection Circuit, as described above. This short pulse may cause a RESET, but it will not cause a SET. In step 836, a verify operation is performed that senses the resistance of the memory cell to detect whether a RESET occurred. For example, a voltage less than Vreset is applied and the current through the memory cell is measured to determined if the memory cell is in the high-resistivity state or the low-resistivity state. If the memory cell is not yet in the RESET state (step 838), then the process loops back to step 834 and another pulse is applied. If the memory cell is verified to have been RESET, then the bit line is unselected in step 840 so that the memory cell 850 does not undergo another RESET operation.

Figure 21:
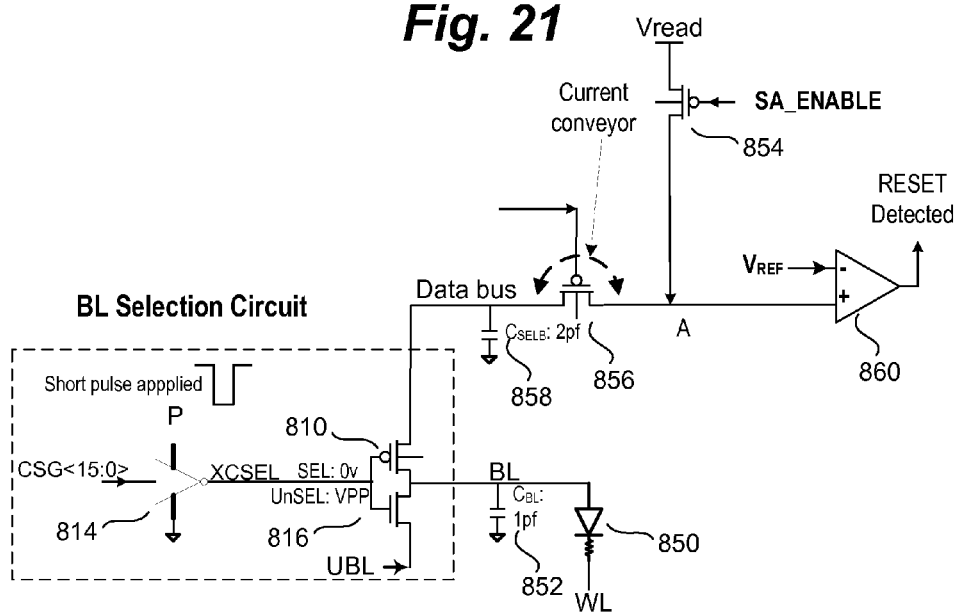
FIG. 21 is a schematic diagram of a circuit that can RESET a memory cell.

The process of FIG. 20 uses a verification step between pulses. This verification step slows down the RESET process. FIG. 21 is a schematic diagram of a circuit that performs the RESET process using a short pulse, but does not use a separate verification step; therefore, increasing the speed of the RESET process.

The circuit of FIG. 21 includes a memory cell 850 that comprises a reversible resistance-switching element and a diode, as described above with respect to FIGS. 1-5. Memory cell 850 is connected to a bit line BL having a capacitance 852. In one embodiment, capacitance 852 is 1 pf. The bit line BL is connected to a Data bus via the BL Selection Circuit. In one embodiment, the each bit line has its own BL selection circuit, and many Bit lines can be connected to a multi-line Data Bus. The BL selection circuit of FIG. 21 is identical to the bit line selection circuit of FIG. 19. The data bus includes a capacitance 858 (e.g., 2 pf).

The Data bus is connected to transistor 856. The gate of transistor 856 is biased at Vread-Vth (approximately 3 volts) so that current flows between the Data bus and node A. Transistor 854 operates similar to transistor 804 of FIG. 19. Transistor 854 receives the signal SA_ENABLE at its gate and, in response to SA_ENABLE, provides Vread (approximately 4 volts) to node A.

During a pulse on the bit line, the memory cell experiences Vread. If the memory cell is conducting, it is in the low-resistivity state and the voltage on the Data bus and at node A drop. This drop in voltage will be detected by comparator 860, which compares the voltage at node A to reference voltage Vref. When the memory cell RESETS to the high-resistivity state, the memory cell will stop conducting and the voltage will rise. This rise in voltage will be detected by comparator 860. The output of comparator 860 thereby provides a status of the memory cell during the pulse. The control logic for the memory system can keep track of which memory cells being RESET in parallel have achieved the RESET and then unselect them. As such, no separate verification step is needed.

Figure 21A:
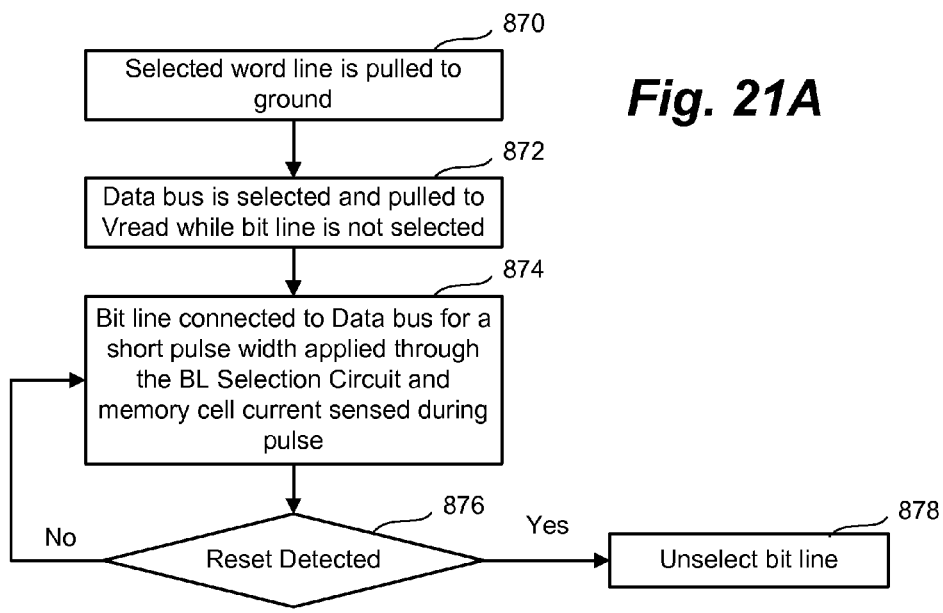
FIG. 21A is a flow chart describing one embodiment of a process for operating the circuit of FIG. 21.

FIG. 21A is a flow chart describing one embodiment of a process for operating the circuit of FIG. 21. In step 870, the selected word line is pulled to ground. In step 872, the Data bus is selected and pulled to Vread by appropriately asserting Data_bit_Enable. The bit lines all remain at a low voltage (e.g., 0 volts). In step 874, the selected bit line is connected to the Data bus for a short pulse which is applied though the BL Selection Circuit, as described above. This short pulse may cause a RESET, but it will not cause a SET. During the short pulse of step 874, the current through the memory cell is sensed and an indication of that sensing is provided to the control logic for the memory system. If the sensing during the pulse detected that a RESET occurred, then control logic unselects the bit line so that the memory cell 850 does not undergo another RESET operation (step 878).

In some embodiments, after a predetermined number of iterations of the process of FIG. 21A that apply the predetermined number of pulses, if the memory cell has not been RESET then system control logic 330 will conclude that the memory cell is stuck or otherwise defective. In that case, the memory cell is replaced by a redundant memory cell. A data structure can maintain a correlation between defective memory cells and replacement memory cells. U.S. Pat. No. 6,868,022, incorporated herein by reference in its entirety, describes a set of embodiments for providing and using redundant memory cells to replace defective memory cells.

In some embodiments, the RESET operation described above is performed on multiple memory cells in parallel. For example, eight or more memory cells may be RESET concurrently. When a particular memory cell is detected to have been properly RESET, system control logic 330 (or another circuit utilized in the RESET process) will store (in a latch or other storage device) an indication that the particular memory cell has been RESET so that it will not be subjected to additional RESET operations.

Figure 22:
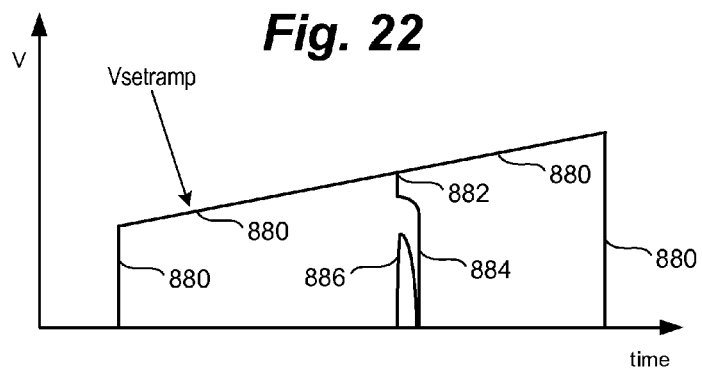
FIG. 22 depicts a voltage pulse applied to a reversible resistance-switching element in order to SET the reversible resistance-switching element.

One embodiment that uses the above-described scheme for performing a RESET can be combined with a system for performing a SET that includes applying a long SET pulse with a rising voltage level to the memory cell. For example, FIG. 22 depicts a pulse 880 with a rising voltage level (labeled as Vsetramp). The current through the memory cell is detected during the voltage pulse. When the SET current is detected, the pulse is terminated. For example, point 882 indicates when the memory cell was SET. At that time the current spikes (see curve 886), which is indicative of the memory cell entering the low resistivity state. The voltage for the memory cell that was SET will initially drop, then almost flatten (while the SET is being detected), and subsequently fall to zero volts as the pulse (for that memory cell) is terminated, as depicted by curve 884. In this way, the minimum voltage level for a SET is applied. Since the diode in the memory cell limits the current and is very dependent on the SET voltage pulse height, the minimum current during SET flows through the memory cell.

Figure 22A:
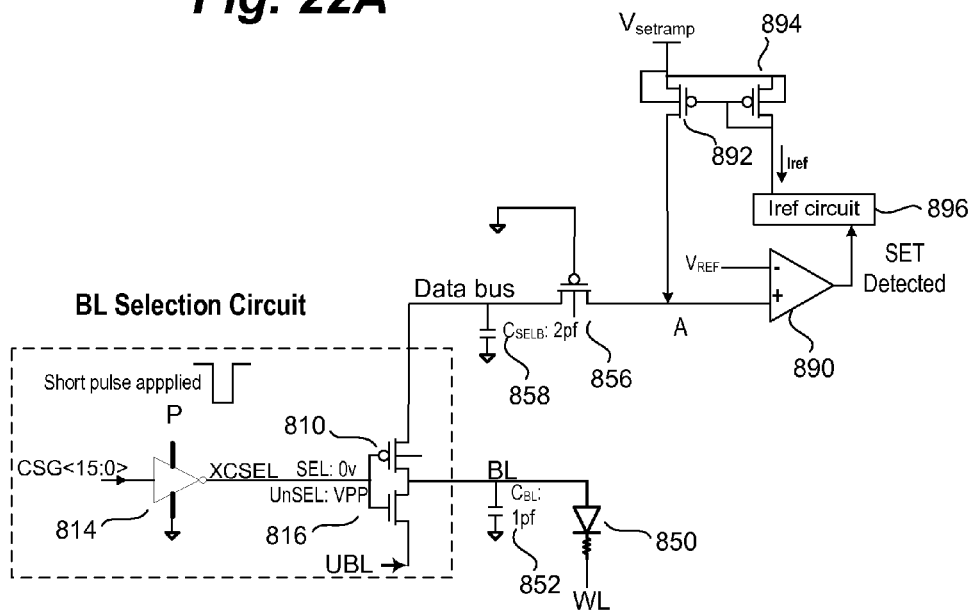
FIG. 22A is a schematic diagram of a circuit that can SET a memory cell.

The circuit of FIG. 21 can be used, with additional components, to achieve the SET operation discussed with respect to FIG. 22. FIG. 22A shows a portion (components 810, 814, 816, 850, 852, 858 and 856) of the circuit of FIG. 21 with additional components 890, 892, 894 and 896. Transistor 856, which has its gate at ground, is connected to comparator 890. The other input of comparator 890 is $V_{REF}$, which ramps proportional to Vsetramp. The output of comparator 890, which indicates whether a SET has been detected, is reported to circuit 896, which generates a reference current Iref for a current mirror. The current mirror includes pmos transistors 892 and 894, both having their source connected to Vsetramp. The current through transistor 892 mirrors Iref.

In operation, the selected word line WL is pulled down to ground. Vsetramp (the long SET pulse with a rising voltage level) is applied to the current minor, as discussed above. The long SET pulse with a rising voltage level (Vsetramp) is provided to the Data bus from the current minor. The bit line BL is connected to the Data Bus for the long pulse, using the BL Selection Circuit. During the pulse, the current is sensed by comparator 890. The current spike 886 will be detected by comparator 860 and an indication will be sent to Iref circuit 896 and System Control Logic 330. In response receiving the indication that the memory cell has been SET, Iref circuit 896 will stop providing Iref to the current mirror and, instead, will provide 0 amps (or a very small current) in order to stop the voltage pulse from being provided to the memory cell. In some embodiments, System Control Logic 330 will terminate the pulse (Vsetramp) in response to the indication that the memory cell has been SET. More information about sensing the memory cell during the programming voltage and stopping programming when sensing the change in state can be found in U.S. Pat. No. 6,574,145, incorporated herein by reference in its entirety.

Smart Detection of SET and RESET

As discussed above, during a SET it is possible for the reversible resistance-switching element to be over-SET so that it then RESETS or oscillates between SET and RESET. Similarly, during a RESET it is possible for the reversible resistance-switching element to be over-RESET so that it then SETS or oscillates between SET and RESET. Another proposed solution it to test, in real-time, for the reversible resistance-switching element to RESET (or SET), and then very quickly stop the programming process before the opposite operation or oscillation begins.

Figure 23:
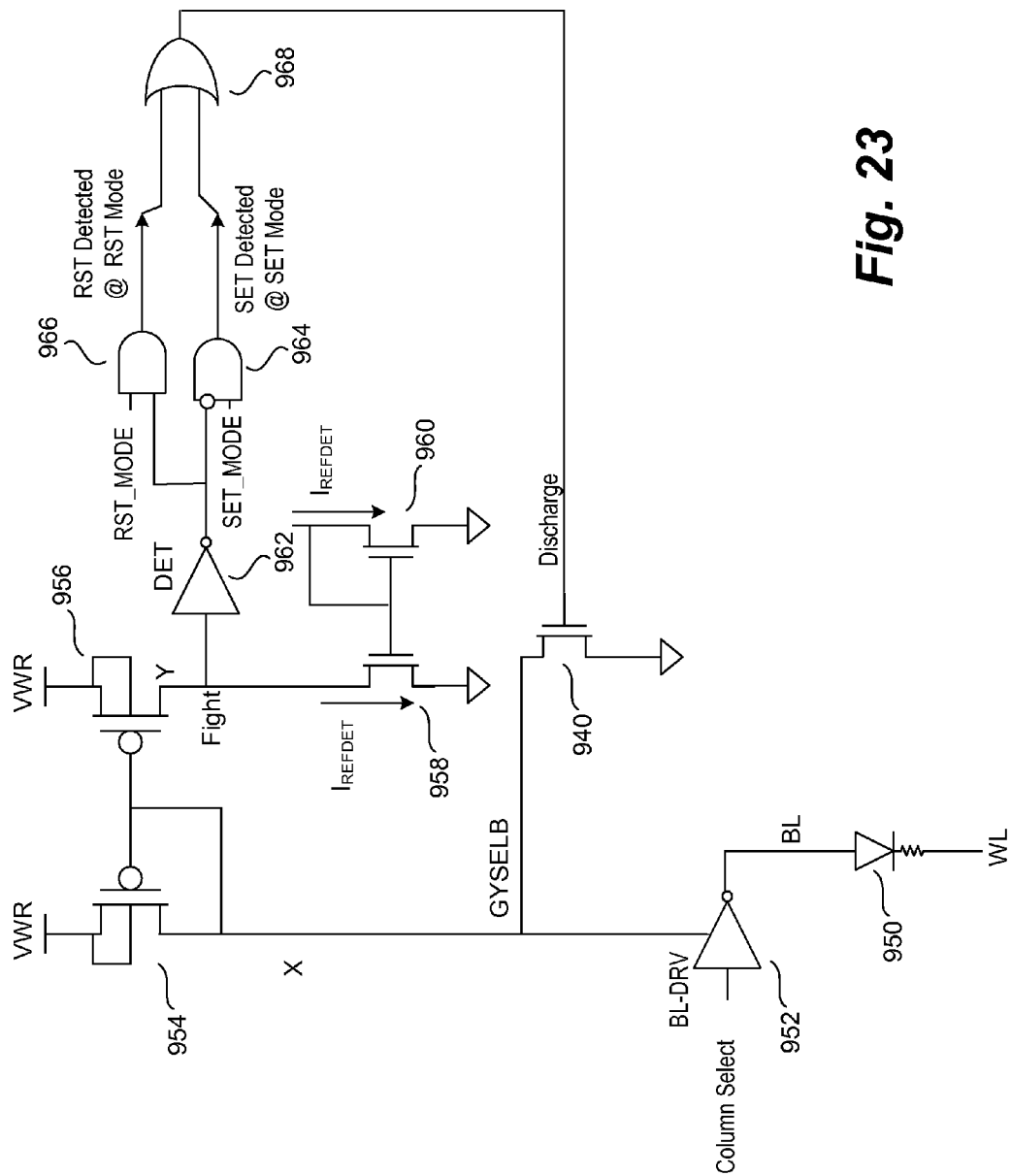
FIG. 23 is a schematic diagram of a circuit that can detect SET and RESET operations.

FIG. 23 is a circuit that provides for fast detection of RESET and SET operations. The circuit depicts a memory cell 950 that comprises a reversible resistance-switching element and a diode, as described above with respect to FIGS. 1-5. Memory cell 950 is connected to bit line BL which is driven by bit line driver 952 in response to a Column Select signal from the column control circuitry. A voltage is provided to the driver 952 from transistor 954. FIG. 23 shows transistor 954 driving voltage VWR-Vt to the bit line, where VWR is the write voltage and Vt is the threshold voltage of transistor 954. When performing a RESET operation, VWR-Vt is a voltage to RESET the reversible resistance-switching element, such as Vreset (see FIG. 7). When performing a SET operation, VWR-Vt is a voltage to SET the reversible resistance-switching element, such as Vset (see FIG. 7).

The detection circuitry of FIG. 23 includes two current minors. The first current minor includes transistors 954 and 956. The current at node X represents the current through the bit line BL when the bit line is selected. The current at node Y mirrors the current at node X. A second current mirror includes transistor 958 and transistor 960. Transistor 960 receives a reference current $I_{REFDET}$ from a circuit in the system control logic. The current through transistor 958 mirrors $I_{REFDET}$. Transistor 958 is connected to transistor 956 at a node labeled as Fight; therefore, the two current minors are connected at node Fight. Since the terminals of the current minors that are connected together are the mirroring terminals (as opposed to the terminals being mirrored) these connected terminals from the two current mirrors could try to act differently and, thus, the connecting node is labeled as Fight. If the current out of the first current mirror at node X is higher then $I_{REFDET}$, then the voltage at Fight will become high. If the current out of the first current minor at node X is lower then $I_{REFDET}$, then the voltage at Fight will become low. The voltage at Fight is provided to inverter 962. The output of inverter 962 is provided to AND gate 966 and an inverted input of AND gate 964. The other input of AND gate 966 is a signal from the system control logic labeled RST_MODE, which is asserted high when the circuit of FIG. 23 is attempting to RESET the reversible resistance-switching element and low otherwise. The other input of AND gate 964 is a signal from the system control logic labeled SET_MODE, which is asserted high when the circuit of FIG. 23 is attempting to SET the reversible resistance-switching element and low otherwise. The outputs of AND gates 964 and 966 are provided to OR gate 968. The output of OR gate 968 is provided to transistor 940, which when turned on will bring the bit line down to ground via node GYSELB.

Note that the circuit of FIG. 23 is depicted for one bit line and one memory cell. It is contemplated that the memory system would have multiple circuits like the circuit depicted in FIG. 23 so that SET or RESET can be performed concurrently for multiple bit lines or for multiple memory cells.

Figure 24A:
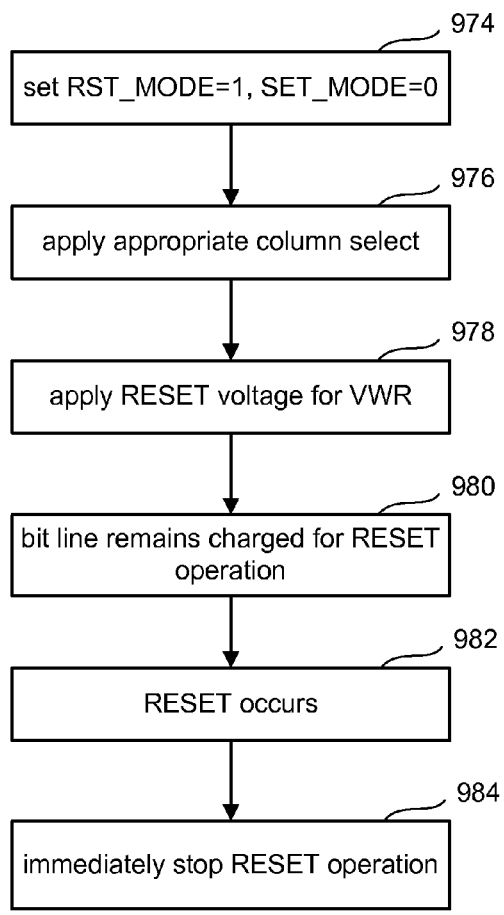
FIGS. 24A and 24B are flow charts describing embodiments of processes for operating the circuit of FIG. 23.

FIG. 24A is a flow chart describing one embodiment of a process for operating the circuit of FIG. 23 during a RESET operation. In step 974, the signal RST_MODE is set to logic 1 and SET_MODE is set to logic 0. In step 976, the column control circuitry applies the appropriate control signals to the bit line driver 952. In step 978, VWR is set to the RESET voltage (e.g., Vreset of FIG. 7). Steps 974 and 978 are performed at the direction of the system control logic (see FIG. 6). In step 980, the bit line remains charged for the RESET operation to be performed. Prior to the RESET operation being successful, the reversible resistance-switching element is in the low-resistivity state; therefore, a high current flows through the memory cell. As a result, the current at node Y is higher than $I_{REFDET}$ and the voltage at Fight will be high and the output of inverter 962 will be low. The output of AND gate 966 and the output of AND gate 964 will be low; therefore, the output of OR gate 968 is low and transistor 940 remains off.

In step 982, the RESET occurs and the reversible resistance-switching element enters the high-resistivity state. Immediately, in step 984, the RESET operation is stopped. Because the reversible resistance-switching element is in the high-resistivity state, the current through the memory cells becomes low which causes the current at node Y to be low. Because the current at bode Y is now lower than $I_{REFDET}$, the voltage at Fight will be low and the output of inverter 962 will be high. The output of AND gate 966 will be high; therefore, the output of OR gate 968 is becomes high and transistor 940 is turned on. Once current can flow through transistor 960, the bit line will dissipate through transistor 940 to ground (via GYSELB), which stops the RESET operation because there is not enough voltage differential across the reversible resistance-switching element.

Figure 24B:
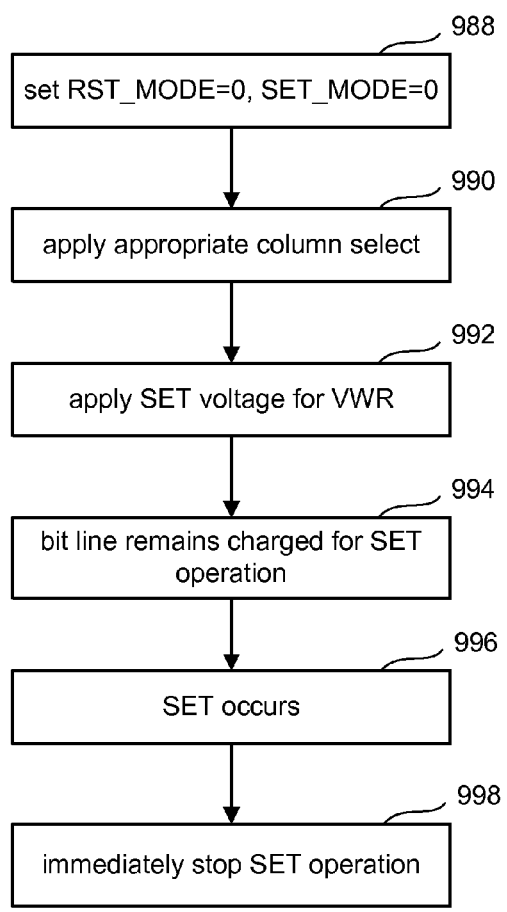

FIG. 24B is a flow chart describing one embodiment of a process for operating the circuit of FIG. 23 during a SET operation. In step 988, the signal RST_MODE is set to logic 0 and SET_MODE is set to logic 1. In step 990, the column control circuitry applies the appropriate control signals to the bit line driver 952. In step 992, VWR is set to the SET voltage (e.g., Vset of FIG. 7). Steps 988 and 992 are performed at the direction of the system control logic 330 (see FIG. 6). In step 994, the bit line remains charged for the SET operation to be performed. Prior to the SET operation being successful, the reversible resistance-switching element is in the high-resistivity state; therefore, a low current flows through the memory cell. As a result, the current at node Y is lower than $I_{REFDET}$, the voltage at Fight will be low, and the output of inverter 962 will be high. The output of AND gate 966 and the output of AND gate 964 will be low; therefore, the output of OR gate 968 is low and transistor 940 remains off.

In step 996, the SET occurs and the reversible resistance-switching element enters the low-resistivity state. Immediately, in step 998, the SET operation is stopped. Because the reversible resistance-switching element is in the low-resistivity state, the current through the memory cells becomes high which causes the current at node Y to be high. Because the current at bode Y is now higher than $I_{REFDET}$, the voltage at Fight will be high and the output of inverter 962 will be low. The output of AND gate 964 will be high; therefore, the output of OR gate 968 is high and transistor 940 is turned on. Once current can flow through transistor 960, the bit line will dissipate through transistor 940 to ground (via GYSELB), which stops the SET operation because there is not enough voltage differential across the reversible resistance-switching element.

In many of the circuit diagrams described above, the depicted circuits can be replaced by the dual of these circuits where NMOS and PMOS device types are exchanged and positive voltages are exchanged with negative voltages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
   a non-volatile storage element;
   a voltage providing circuit that selectively provides a programming voltage, the non-volatile storage element changes from a first predetermined resistance state to a second predetermined resistance state in response to a first voltage magnitude, the non-volatile storage element changes from the second predetermined resistance state to the first predetermined resistance state in response to a second voltage magnitude, the second voltage magnitude is larger than the first voltage magnitude, the programming voltage is at least as large the second voltage magnitude; and
   a selection circuit that receives a pulse, the selection circuit selectively connects the non-volatile storage element to the voltage providing circuit for a first period of time during the pulse to change the non-volatile storage element in the first period of time to the second predetermined state, the first period of time is shorter than needed to change the non-volatile storage element to the first predetermined resistance state in response to the programming voltage, the selection circuit connects the non-volatile storage element to an unselected control voltage before and after the pulse.

2. The non-volatile storage system of claim 1, wherein the selection circuit comprises:
   an inverter having a data input and power input and output, the inverter receives a selection signal at the data input and the pulse at the power input;
   a first switch with a gate in communication with the output of the inverter; and
   a second switch with a gate in communication with the output of the inverter, the first switch is in communication with the voltage providing circuit and a control line for the non-volatile storage element, the second switch is in communication to the control line for the non-volatile storage element and the unselected control voltage.

3. The non-volatile storage system of claim 2, wherein the voltage providing circuit comprises:
a third switch receiving the programming voltage at a first terminal and a selection signal at a second terminal; and
a data line in communication with the first switch and a third terminal of the third switch, the third switch selectively provides the programming voltage to the data line in response to the selection signal.

4. The non-volatile storage system of claim 1, further comprising:
a sensing circuit in communication with the voltage providing circuit, the sensing circuit senses a particular voltage at the voltage providing circuit that indicates that the non-volatile storage element changed from the first predetermined resistance state to the second predetermined resistance state, the sensing circuit outputs an indication that the non-volatile storage element changed from the first predetermined resistance state to the second predetermined resistance state in response to sensing the particular voltage.

5. The non-volatile storage system of claim 1, wherein:
the voltage providing circuit includes a data line in communication with the selection circuit;
the non-volatile storage system further comprises a rising pulse providing circuit in communication with the data line and a transition detection circuit in communication with the data line and the rising pulse providing circuit;
the rising pulse providing circuit provide a voltage pulse with a rising magnitude;
the transition detection circuit detects a predetermined current change in the non-volatile storage element and outputs an indication that the non-volatile storage element has changed to the first resistance state in response to detecting the predetermined current change in the non-volatile storage element; and
the rising pulse providing circuit terminates the voltage pulse before the voltage pulse is completed in response to the indication that the non-volatile storage element has changed to the first resistance state.

6. The non-volatile storage system of claim 1, wherein:
the non-volatile storage element includes reversible resistance-switching material and a steering device.

7. The non-volatile storage system of claim 6, wherein:
the first predetermined resistance state is a low resistance state; and
the second predetermined resistance state is a high resistance state.

8. The non-volatile storage system of claim 1, wherein:
the non-volatile storage element is part of a monolithic three dimensional memory array.

9. A non-volatile storage system, comprising:
a non-volatile storage element; and
an electrical circuit in communication with the non-volatile storage element, the electrical circuit programs the non-volatile storage element from a first predetermined resistance state to a second predetermined resistance state by a applying a programming voltage to the non-volatile storage element for a first period of time in response to a pulse, the electrical circuit applies an unselected control voltage to the non-volatile storage element before and after the pulse, the non-volatile storage element changes from the first predetermined resistance state to the second predetermined resistance state in response to a first voltage magnitude, the non-volatile storage element changes from the second predetermined resistance state to the first predetermined resistance state in response to a second voltage magnitude that is larger than the first voltage magnitude, the programming voltage is at least as large as the second voltage magnitude, the first period of time is shorter than needed to change the non-volatile storage element to the first predetermined resistance state in response to the programming voltage.

10. The non-volatile storage system of claim 9, wherein:
the non-volatile storage element includes reversible resistance-switching material and a steering device;
the first predetermined resistance state is a low resistance state for the reversible resistance-switching material; and
the second predetermined resistance state is a high resistance state for the reversible resistance-switching material.

11. The non-volatile storage system of claim 9, wherein:
the non-volatile storage element is part of a monolithic three dimensional memory array.

12. The non-volatile storage system of claim 9, further comprising:
a sensing circuit in communication with the electrical circuit, the sensing circuit senses a predetermined voltage condition at the electrical circuit during the first period that indicates that the non-volatile storage element changed from the first predetermined resistance state to the second predetermined resistance state, the sensing circuit outputs during the first period an indication that the non-volatile storage element changed from the first predetermined resistance state to the second predetermined resistance state in response to sensing the predetermined voltage condition.

13. A method for programming non-volatile storage, comprising:
accessing a pulse signal that provide a pulse;
in response to the pulse, applying a programming voltage for a first period of time to program a non-volatile storage element from a first predetermined resistance state to a second predetermined resistance state during the first period of time, the non-volatile storage element changes from the first predetermined resistance state to the second predetermined resistance state in response to a first voltage magnitude, the non-volatile storage element changes from the second predetermined resistance state to the first predetermined resistance state in response to a second voltage magnitude that is larger than the first voltage magnitude, the programming voltage is at least as large as the second voltage magnitude, the first period of time is shorter than needed to change the non-volatile storage element to the first predetermined resistance state in response to the programming voltage; and
applying an unselected control voltage to the non-volatile storage element before and after the pulse.

14. The method of claim 13, wherein:
the first predetermined resistance state is a low resistance state; and
the second predetermined resistance state is a high resistance state.

15. The method of claim 13, wherein:
the applying of the programming voltage comprises applying a voltage to a data line and switching a selection circuit in response to the pulse so that the selection circuit connects the data line to a control line during the pulse, the control line is in communication with the non-volatile storage element.

16. The method of claim 15, further comprising:
sensing a voltage at the data line during the first time period; and
reporting that the non-volatile storage element is in the second predetermined resistance state in response to sensing the voltage at the data line.

17. The method of claim 13, further comprising:
programming the non-volatile storage element from the second predetermined resistance state to the first predetermined resistance state by applying a programming pulse with a rising amplitude to a data line in communication with the nonvolatile storage element;
sensing a particular voltage at the data line during the programming pulse with the rising amplitude; and
terminating the programming pulse with the rising amplitude in response to sensing the particular voltage at the data line.

18. The method of claim 13, wherein:
the non-volatile storage element includes reversible resistance-switching material and a steering device.

19. A method for programming a non-volatile storage element, comprising:
receiving a pulse;
receiving a programming voltage, the non-volatile storage element changes from a first predetermined resistance state to a second predetermined resistance state in response to a first voltage magnitude, the non-volatile storage element changes from the second predetermined resistance state to the first predetermined resistance state in response to a second voltage magnitude, the second voltage magnitude is larger than the first voltage magnitude, the received programming voltage is at least as large the second voltage magnitude; and
in response to the pulse, connecting the non-volatile storage element to the programming voltage for a first period of time to program the non-volatile storage element from the first predetermined resistance state to the second predetermined resistance state during the first period of time, the first period of time is shorter than needed to change the non-volatile storage element to the first predetermined resistance state in response to the programming voltage.

20. The method of claim 19, further comprising:
connecting the unselected control voltage to the non-volatile storage element before and after the pulse.

21. The method of claim 19, wherein:
the first predetermined resistance state is a low resistance state; and
the second predetermined resistance state is a high resistance state.

22. The method of claim 19, wherein:
the non-volatile storage element includes reversible resistance-switching material and a steering device; and
the connecting the non-volatile storage element to the programming voltage for the first period of time changes resistance of the reversible resistance-switching material.

* * * * *